(12) United States Patent
Ito

(10) Patent No.: US 6,819,581 B2
(45) Date of Patent: Nov. 16, 2004

(54) FERROELECTRIC NONVOLATILE SEMICONDUCTOR MEMORY

(75) Inventor: Yasuyuki Ito, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/250,822

(22) PCT Filed: Oct. 30, 2002

(86) PCT No.: PCT/JP02/11259
§ 371 (c)(1),
(2), (4) Date: Jul. 3, 2003

(87) PCT Pub. No.: WO03/041172
PCT Pub. Date: May 15, 2003

(65) Prior Publication Data
US 2004/0047219 A1 Mar. 11, 2004

(30) Foreign Application Priority Data
Nov. 5, 2001 (JP) ........................ 2001-339372

(51) Int. Cl.[7] .............................................. G11C 11/22
(52) U.S. Cl. ...................................... 365/145; 365/149
(58) Field of Search ................................. 365/145, 149

(56) References Cited

U.S. PATENT DOCUMENTS

| | | | |
|---|---|---|---|
| 5,375,085 A | 12/1994 | Gnade et al. | |
| 5,487,029 A | 1/1996 | Kuroda | |
| 5,943,256 A * | 8/1999 | Shimizu et al. | ............. 365/145 |
| 6,301,145 B1 | 10/2001 | Nishihara | |
| 6,548,904 B2 * | 4/2003 | Iwasaki et al. | ............. 257/758 |
| 6,664,118 B2 * | 12/2003 | Nishihara et al. | ............. 483/3 |

FOREIGN PATENT DOCUMENTS

| | | |
|---|---|---|
| JP | 07-115141 A | 5/1995 |
| JP | 09-116107 A | 5/1997 |
| JP | 2001-122698 A | 5/2001 |

* cited by examiner

*Primary Examiner*—Huan Hoang
(74) *Attorney, Agent, or Firm*—Robert J. Depke; Holland & Knight LLP

(57) ABSTRACT

A ferroelectric-type nonvolatile semiconductor memory comprises a bit line $BL_1$, a transistor for selection $TR_1$, (C) a memory unit $MU_1$ composed of memory cells that are M in number (M≧2), and (D) plate lines PL that are M in number; in which each memory cell comprises a first electrode 21, 31, a ferroelectric layer 22, 32 and a second electrode 33, 34, in the memory unit $MU_1$, the first electrodes 21, 31 of the memory cells are in common, the ferroelectric layer 22, 32 is composed of lead titanate zirconate [Pb($Zr_x$,$Ti_y$)$O_3$], and said lead titanate zirconate has a composition that satisfies 0.6<Y/(X+Y)≦0.9.

8 Claims, 25 Drawing Sheets

US 6,819,581 B2

FERROELECTRIC NONVOLATILE SEMICONDUCTOR MEMORY

This application claims priority to International Application No. PCT/JP02/11259, filed Oct. 30, 2002 and Japanese Patent Application Number JP2001-339372, filed Nov. 5, 2001, each of which are incorporated herein by reference.

TECHNICAL FIELD

The present invention relates to a ferroelectric-type nonvolatile semiconductor memory (so-called FERAM).

BACKGROUND ART

In recent years, studies are actively made with regard to a ferroelectric-type nonvolatile semiconductor memory having a large capacity. A ferroelectric-type nonvolatile semiconductor memory (to be sometimes abbreviated as "nonvolatile memory" hereinafter) permits rapid access and is nonvolatile and small, and it consumes less electric power and has strength against an impact, so that it is expected to be used as a main storage device in various electronic machines and equipment having functions of file storage and resume, such as a portable computer, a cellular phone and a game machine, or as a recording medium for recording voices or images.

The above nonvolatile memory is a fast rewritable nonvolatile memory according to a method in which a change in an accumulated charge amount in a capacitor member having a ferroelectric layer is detected by utilizing fast polarization inversion and residual polarization of the ferroelectric layer, and the nonvolatile memory basically comprises the memory cell (capacitor member) and a transistor for selection (transistor for switching). The memory cell (capacitor member) comprises, for example, a lower electrode, an upper electrode and the ferroelectric layer interposed between these electrodes. Data is written into and read out from the above nonvolatile memory by using the P-E (V) hysteresis loop of the ferroelectric layer shown in FIG. 23. That is, when an external electric field is applied to the ferroelectric layer and then removed, the ferroelectric layer exhibits residual polarization. When an external electric field in the plus direction is applied, the residual polarization of the ferroelectric layer comes to be $+P_r$, and when an external electric field in the minus direction is applied, it comes to be $-P_r$. When the residual polarization is in the state of $+P_r$ (see "D" in FIG. 23), such a state represents "0", and when the residual polarization is in the state of $-P_r$ (see "A" in FIG. 23), such a state represents "1".

For discriminating the state of "1" or "0", an external electric field, for example, in the plus direction is applied to the ferroelectric layer, whereby the polarization of the ferroelectric layer comes into the state of "C" in FIG. 23. In this case, when the data is "0", the polarization state of the ferroelectric layer changes from the state of "D" to the state of "C". When the data is "1", the polarization state of the ferroelectric layer changes from the state of "A" to the state of "C" through the state of "B". When the data is "0", the polarization inversion does not take place in the ferroelectric layer. When the date is "1", the polarization inversion takes place in the ferroelectric layer. As a result, there is caused a difference in the accumulated charge amount in the memory cell (capacitor member). The above accumulated charge is detected as a signal current by bringing, into an ON-state, the transistor for selection in a selected nonvolatile memory. When the external electric field is brought into 0 after data is read out, the polarization state of the ferroelectric layer comes into the state of "D" in FIG. 23 both when the data is "0" and when it is "1". That is, when the data is read out, the data "1" is once destroyed. When the data is "1", therefore, the polarization is brought into the state of "A" through "D" and "E" by applying the external electric field in the minus direction, to re-write data "1".

$ABO_3$ type ferroelectric oxides such as lead titanate zirconate [PZT, $Pb(Zr,Ti)O_3$] and lanthanum lead titanate zirconate [$(Pb,La)(Zr,Ti)O_3$] have been mainly developed as a ferroelectric material for constituting the ferroelectric layer, and part of them has been put to practical use in a nonvolatile memory.

The structure and the operation of a currently mainstream nonvolatile memory are proposed by S. Sheffiled et al. in U.S. Pat. No. 4,873,664. The above nonvolatile memory comprises two nonvolatile memory cells as shown in a circuit diagram of FIG. 24. In FIG. 24, each nonvolatile memory is surrounded by a dotted line. Each nonvolatile memory comprises, for example, transistors for selection $TR_{11}$ and $TR_{12}$ and memory cells (capacitor members) $FC_{11}$ and $FC_{12}$.

Concerning two-digit or three-digit subscripts, for example, a subscript "11" is a subscript that should be shown as "1,1", and for example, a subscript "111" is a subscript that should be shown as "1,1,1". For simplified showing, the subscripts are shown as two-digit or three-digit subscripts. Further, a subscript "M" is used to show, for example, a plurality of memory cells or plate lines in the block, and a subscript "m" is used to show an individual, for example, of a plurality of the memory cells or the plate lines. A subscript "N" is used to show, for example, transistors for selection or memory units in the block, and a subscript "n" is used to show, for example, an individual of the transistors for selection or the memory units.

Complementary data is written into a pair of the memory cells, and the nonvolatile memory stores 1 bit. In FIG. 24, symbol "WL" stands for a word line, symbol "BL" stands for a bit line, and symbol "PL" stands for a plate line. When one nonvolatile memory is taken, the word line $WL_1$ is connected to a word line decoder/driver WD. The bit lines $BL_1$ and $BL_2$ are connected to a sense amplifier SA. Further, the plate line $PL_1$ is connected to a plate line decoder/driver PD.

When the stored data is read out from the thus-structured nonvolatile memory, the word line $WL_1$ is selected, and further, the plate line $PL_1$ is driven. In this case, the complementary data appears on a pair of the bit lines $BL_1$ and $BL_2$ as voltages (bit line potentials) from a pair of the memory cells (capacitor members) $FC_{11}$ and $FC_{12}$ through the transistors for selection $TR_{11}$, and $TR_{12}$. The voltages (bit line potentials) on the pair of the bit lines $BL_1$ and $BL_2$ are detected with the sense amplifier SA.

One nonvolatile memory occupies a region surrounded by the word line $WL_1$ and a pair of the bit lines $BL_1$ and $BL_2$. If the word lines and the bit lines are arranged at a smallest pitch, therefore, the smallest area of one nonvolatile memory is $8F^2$ when the minimum fabrication dimension is "F". Therefore, the thus-structured nonvolatile memory has a smallest area of $8F^2$.

When it is attempted to increase the capacity of the above-structured nonvolatile memories, its realization can only rely on minuteness of fabrication dimension. Constitution of one nonvolatile memory requires two transistors for selection and two memory cells (capacitor members). Further, it is required to arrange the plate lines at the same pitch as that at which the word lines are arranged. It is therefore almost impossible to arrange the nonvolatile memories at the minimum pitch, and in reality, the area that one nonvolatile memory occupies comes to be much greater than $8F^2$.

Moreover, it is also required to arrange the word line decoders/drivers WD and the plate line decoders/drivers PD at a pitch equal to a pitch at which the nonvolatile memories are arranged. In other words, two decoders/drivers are required for selecting one low-address. It is therefore difficult to layout peripheral circuits, and the area that the peripheral circuits occupy comes to be large.

One means for decreasing an area of a nonvolatile memory is disclosed in JP-A-121032/1997. As FIG. 25 shows a circuit diagram, the nonvolatile memory disclosed in the above Laid-open comprises a plurality of memory cells $MC_{1M}$ (for example, M=4) one end of each of which is connected to one end of one transistor for selection $TR_1$ in parallel, and a plurality of memory cells $MC_{2M}$ one end of each of which is connected to one end of one transistor for selection $TR_2$ in parallel. The other ends of the transistors for selection $TR_1$ and $TR_2$ are connected to bit lines $BL_1$ and $BL_2$, respectively. The paired bit lines $BL_1$ and $BL_2$ are connected to a sense amplifier SA. Further, the other end of each of the paired memory cells $MC_{1m}$, $MC_{2m}$ (m=1, 2 ... M) is connected to a common plate line $PL_m$, and the plate line $PL_m$ is connected to a plate line decoder/driver PD. Further, the word line WL is connected to a word line decoder/driver WD.

Complementary data is stored in a pair of the memory cells $MC_{1m}$ and $MC_{2m}$ (m=1, 2 ... M). For reading out the data stored, for example, in the memory cells $MC_{1m}$ and $MC_{2m}$ (wherein m is one of 1, 2, 3 and 4), the word line WL is selected, and the plate line $PL_m$ is driven in a state where a voltage of $(\frac{1}{2})V_{cc}$ or $(\frac{1}{3})V_{cc}$ is applied to the plate lines $PL_j$ (m≠j). The above $V_{cc}$ is, for example, a power source voltage. By the above procedure, the complementary data appears on a pair of the bit lines $BL_1$ and $BL_2$ as voltages (bit line potentials) from a pair of the memory cells $MC_{1m}$ and $MC_{2m}$ through the transistors for selection $TR_1$ and $TR_2$. And, the sense amplifier SA detects the voltages (bit line potentials) on the pair of the bit lines $BL_1$ and $BL_2$.

A pair of the transistors for selection $TR_1$ and $TR_2$ in the paired nonvolatile memories occupy a region surrounded by the word lines WL and a pair of the bit lines $BL_1$ and $BL_2$. If the word lines and the bit lines are arranged at a smallest pitch, therefore, a pair of the transistors for selection $TR_1$ and $TR_2$ in the paired nonvolatile memories have a minimum area of $8F^2$. Since, however, a pair of the transistors for selection $TR_1$ and $TR_2$ are shared by M sets of pairs of the memory cells $MC_{1m}$ and $MC_{2m}$ (m=1, 2 ... M), the number of the transistors for selection $TR_1$ and $TR_2$ per bit can be decreased, and the layout of the word lines WL is moderate, so that the nonvolatile memory can be easily decreased in size. Further, with regard to the peripheral circuits, M bits can be selected with one word line decoder/driver WD and the plate line decoders/drivers PD that are M in number. When the above constitution is employed, therefore, the layout in which the cell area is close to $8F^2$ can be attained, and a chip size almost equal to a DRAM can be attained.

The method of decreasing the area of a nonvolatile memory, disclosed in JP-A-121032/1997, is very effective, but has the following problem.

That is, when data "1" is written into the memory cell $MC_{11}$ in a pair of the memory cells $MC_{11}$ and $MC_{21}$, the plate line $PL_1$ is brought to a ground level (0 volt), and $V_{cc}$ is applied to the bit line $BL_1$, to polarize the ferroelectric layer. In this case, it is required to bring the bit line $BL_2$ to a ground level (0 volt) for retaining data "0" in the memory cell $MC_{21}$.

For preventing destruction of data stored in the memory cells $MC_{1m}$ and $MC_{2m}$ (m=2, 3, 4) connected to non-selected plate lines $PL_m$ (m=2, 3, 4), the potential of the non-selected plate lines $PL_m$ (m=2, 3, 4) is fixed at $(\frac{1}{2})V_{cc}$ or $(\frac{1}{3})V_{cc}$ that is an intermediate potential between the bit lines $BL_1$ and $BL_2$, to ease or relax the electric field that is to be applied to the ferroelectric layer constituting the non-selected memory cells $MC_{1m}$ and $MC_{2m}$. That is, disturbance of $(\frac{1}{2})V_{cc}$ or $(\frac{1}{3})V_{cc}$ is exerted on the non-selected memory cells $MC_{1m}$ and $MC_{2m}$. The above disturbance refers to a phenomenon in which an electric field is exerted on a ferroelectric layer constituting a non-selected memory cell in a direction in which the polarization is inverted, that is, a direction in which data stored is deteriorated or destroyed. When the nonvolatile memory is composed of the memory cells that are M in number, the number of times of disturbance exerted on one memory cell is (M−1) times. Each memory cell is therefore required to retain a sufficient signal amount (accumulated charge) after it suffers disturbance (M−1) times.

However, in conventional nonvolatile memories typified by the nonvolatile memory disclosed in U.S. Pat. No. 4,873,664, no memory cells are caused to have any disturbance, so that nothing is taken into account with regard to disturbance durability as a property required of a ferroelectric material. When a ferroelectric material used for a conventional nonvolatile memory, such as PZT, is applied to a nonvolatile memory that structurally suffers disturbance, therefore, there is involved a problem that no sufficient disturbance durability is attained.

It is therefore an object of the present invention to optimize the composition of a ferroelectric material for constituting a ferroelectric layer in a ferroelectric-type nonvolatile semiconductor memory that essentially structurally suffers disturbance, so that there can be provided a ferroelectric-type nonvolatile semiconductor memory having high durability against disturbance.

DISCLOSURE OF THE INVENTION

A ferroelectric-type nonvolatile semiconductor memory according to a first aspect of the present invention for achieving the above object comprises;

(A) a bit line, (B) a transistor for selection, (C) a memory unit composed of memory cells that are M in number (M≧2), and (D) plate lines that are M in number, in which each memory cell comprises a first electrode, a ferroelectric layer and a second electrode, in the memory unit, the first electrodes of the memory cells are in common, said common first electrode is connected to the bit line through the transistor for selection, in the memory unit, the second electrode of the m-th-place (m=1, 2 ..., M) memory cell is connected to the m-th-place plate line, the ferroelectric layer constituting each memory cell is composed of lead titanate zirconate [Pb(Zr$_X$,Ti$_Y$)O$_3$], and said lead titanate zirconate has a composition that satisfies $0.6 < Y/(X+Y) \leq 0.9$.

A ferroelectric-type nonvolatile semiconductor memory according to a second aspect of the present invention for achieving the above object comprises;

(A) a bit line, (B) a transistor for selection, (C) memory units that are N in number (N≧2), each memory unit being composed of memory cells that are M in number (M≧2), and (D) plate lines that are M×N in number, in which the memory units that are N in number are stacked through an insulating interlayer, each memory cell comprises a first electrode, a ferroelectric layer and a second electrode, in each memory unit, the first electrodes of the memory cells are in common, said common first electrode is connected to the bit line through the transistor for selection, in the memory unit of the n-th layer (n=1, 2 . . . , N), the second electrode of the m-th-place (m=1, 2 . . . , M) memory cell is connected to the [(n−1)M+m]-th-place plate line, the ferroelectric layer constituting each memory cell is composed of lead titanate zirconate $[Pb(Zr_X,Ti_Y)O_3]$, and said lead titanate zirconate has a composition that satisfies $0.6<Y/(X+Y)\leq 0.9$.

A ferroelectric-type nonvolatile semiconductor memory according to a third aspect of the present invention for achieving the above object comprises;

(A) a bit line, (B) transistors for selection that are N in number (N≧2), (C) N memory units that are N in number, each memory unit being composed of memory cells that are M in number (M≧2), and (D) plate lines that are M in number, in which the memory units that are N in number are stacked through an insulating interlayer, each memory cell comprises a first electrode, a ferroelectric layer and a second electrode, in each memory unit, the first electrodes of the memory cells are in common, in the memory unit of the n-th layer (n=1, 2 . . . , N), the common first electrode is connected to the bit line through the n-th-place transistor for selection, in the memory unit of the n-th layer, the second electrode of the m-th-place (m=1, 2 . . . , M) memory cell is connected to the m-th-place plate line common to the memory units, the ferroelectric layer constituting each memory cell is composed of lead titanate zirconate $[Pb(Zr_X,Ti_Y)O_3]$, and said lead titanate zirconate has a composition that satisfies $0.6<Y/(X+Y)\leq 0.9$.

A ferroelectric-type nonvolatile semiconductor memory according to a fourth aspect of the present invention for achieving the above object comprises;

(A) bit lines that are N in number (N≧2), (B) transistors for selection that are N in number, (C) memory units that are N in number, each memory cell being composed of memory cells that are M in number (M≧2), and (D) plate lines that are M in number, in which the memory units that are N in number are stacked through an insulating interlayer, each memory cell comprises a first electrode, a ferroelectric layer and a second electrode, in each memory unit, the first electrodes of the memory cells are in common, in the memory unit of the n-th layer (n=1, 2 . . . , N), the common first electrode is connected to the n-th-place bit line through the n-th-place transistor for selection, in the memory unit of the n-th layer, the second electrode of the m-th-place (m=1, 2 . . . , M) memory cell is connected to the m-th-place plate line common to the memory units, the ferroelectric layer constituting each memory cell is composed of lead titanate zirconate $[Pb(Zr_X,Ti_Y)O_3]$, and said lead titanate zirconate has a composition that satisfies $0.6<Y/(X+Y)\leq 0.9$.

In the ferroelectric-type nonvolatile semiconductor memories according to the first to fourth aspects of the present invention (these will be sometimes simply generally referred to as "nonvolatile memory of the present invention" hereinafter), a lead titanate zirconate (to be sometimes called "PZT" for short hereinafter) that has a perovskite structure and is a solid solution of lead titanate $[PbTiO_3]$ and lead zirconate $[PbZrO_3]$ has a composition that satisfies $0.6<Y/(X+Y)\leq 0.9$, whereby the ferroelectric layer can have a sufficiently large coercive electric field, a well-rectangular P-E(V) hysteresis loop and a sufficiently large residual polarization $\pm P_r$, so that the memory cells are improved in disturbance durability. For further improving the disturbance durability and preventing an increase in leak current or deterioration of dielectric strength, preferably, the above composition satisfies $0.7<Y/(X+Y)\leq 0.85$. When the above expression is $Y/(X+Y)\leq 0.6$, no excellent disturbance durability can be obtained. When it is $0.9<Y/(X+Y)$, the leak current increases or the dielectric strength is deteriorated.

Concerning whether or not the composition of PZT satisfies $0.6<Y/(X+Y)\leq 0.9$, the composition can be analyzed by a physical analysis method such as a fluorescence X-ray analysis method or an EPMA (Electron Problem Micro Analysis) method or by a chemical analysis method such as an ICP (Inductively Coupled Plasma) method or general chemical analysis.

In the nonvolatile memory according to any one of the second to fourth aspects of the present invention, since one transistor for selection is shared by a plurality of the memory cells and the memory units have the three-dimensional stack structure, a limitation imposed by the number of transistors occupying the semiconductor substrate surface is removed, the storage capacity can be remarkably enhanced as compared with any conventional ferroelectric-type nonvolatile semiconductor memory, and the effective occupation area of bit storage units can be greatly decreased. Address selection in the row direction is performed by means of a two-dimensional matrix composed of the transistors for selection and the plate lines. For example, when a row address selection unit is composed of 8 transistors for selection and 8 plate lines, 64-bit memory cells can be selected with 16 decoder/driver circuits. Even when the integration degree of a ferroelectric-type nonvolatile semiconductor memory is equal to that of a conventional ferroelectric-type nonvolatile semiconductor memory, the storage capacity can be quadrupled. Further, the number of peripheral circuits and driving wirings for address selection can be reduced.

In the nonvolatile memory of the present invention, it is sufficient to satisfy M≧2, and for example, the practical value of M includes exponents of 2 (2, 4, 8 . . . ). Further, in the nonvolatile memory according to any one of the second to fourth aspects of the present invention, it is sufficient to satisfy N≧2, and for example, the practical value of N includes exponents of 2 (2, 4, 8 . . . ).

The PZT in the present invention includes PLZT [$(Pb, La)(Zr_X,Ti_Y)O_3$] that is a metal oxide obtained by adding lanthanum (La) to PZT, PNZT[$(Pb,Nb)(Zr_X,Ti_Y)O_3$] that is a metal oxide obtained by adding niobium (Nb) to PZT, PCZT[$(Pb,Ca)(Zr_X,Ti_Y)O_3$] that is a metal oxide obtained by adding calcium (Ca) to PZT, PSZT[(Pb,Sr)(Zr$_X$,Ti$_Y$)O$_3$] that is a metal oxide obtained by adding strontium (Sr) to PZT, and mixtures of these metal oxides. PLZT, PNZT, PCZT, PSZT and mixtures of these have compositions that satisfy $0.6<Y/(X+Y)\leq0.9$.

The ferroelectric layer can be obtained by patterning the ferroelectric thin film in a step following the formation of the ferroelectric thin film. In some cases, the patterning of the ferroelectric thin film is not required. The ferroelectric thin film can be formed, for example, by a method such as a sputtering method including a magnetron sputtering method and a reactive sputtering method; a pulse laser abrasion method; an electron beam deposition method; a solution chemical deposition method (sol-gel method) including a spraying method and a spin-coating method; an MOCVD method; and an LSMCD (Liquid Source Mist Chemical Deposition) method. The ferroelectric thin film can be patterned, for example, by an anisotropic ion etching (RIE) method.

The crystalline orientation of PZT constituting the ferroelectric layer is preferably a unidirectional orientation, particularly preferably a (111) unidirectional orientation. PZT satisfying $0.6<Y/(X+Y)\leq0.9$ is a so-called Ti-rich PZT, and such a PZT has the crystal structure of a cubic system. When the crystal orientation of PZT is a (111) unidirectional orientation, excellent switching characteristics can be obtained, and as a result, excellent disturbance durability can be attained.

For obtaining a highly reliable ferroelectric layer, preferably, the PZT constituting the ferroelectric layer has a density of 6750 kg/m$^3$ (6.75 g/cm$^3$) to 8000 kg/m$^3$ (8.9 g/cm$^3$).

In the present invention, there may be employed a constitution in which the first electrode is formed below the ferroelectric layer and the second electrode is formed on the ferroelectric layer (that is, the first electrode corresponds to the lower electrode and the second electrode corresponds to the upper electrode), or there may be employed a constitution in which the first electrode is formed on the ferroelectric layer and the second electrode is formed below the ferroelectric layer (that is, the first electrode corresponds to the upper electrode and the second electrode corresponds to the lower electrode). There may be employed a constitution in which the plate line extends from the second electrode, or there may be employed a constitution in which the plate line is formed separately from the second electrode and is connected to the second electrode. In the latter case, the wiring material for constituting the plate line includes, for example, aluminum and an aluminum-containing alloy.

The structure in which the first electrodes are in common specifically includes a structure in which the first electrode in the form of a stripe is formed and the ferroelectric layer is formed on the entire surface of the first electrode in the form of a stripe. In the above structure, an overlapping region of the first electrode, the ferroelectric layer and the second electrode corresponds to the memory cell. Alternatively, the structure in which the first electrodes are in common includes a structure in which ferroelectric layers are formed on predetermined regions of the first electrode and the second electrodes are formed on the ferroelectric layers, and a structure in which the first electrodes are formed in predetermined surface regions of a wiring layer, the ferroelectric layers are formed on the first electrodes and the second electrodes are formed on the ferroelectric layers, although the above structure shall not be limited thereto.

In the present invention, desirably, the first electrode and the second electrode are formed of at least one metal selected from platinum group metals or oxide thereof, or formed of at least one metal selected from the group consisting of ruthenium (Ru), rhodium (Rh), palladium (Pd), osmium (Os), iridium (Ir), platinum (Pt) and rhenium (Re) or oxide thereof. Specific examples of the above metals or oxides include Ir, IrO$_{2-X}$, IrO$_{2-X}$/Ir, Ir/IrO$_{2-X}$, SrIrO$_3$, Ru, RuO$_{2-X}$, SrRuO$_3$, Pt, Pt/IrO$_{2-X}$, Pt/RuO$_{2-X}$, Pd, a Pt/Ti stacked structure, a Pt/Ta stacked structure, a Pt/Ti/Ta stacked structure, La$_{0.5}$Sr$_{0.5}$CoO$_3$(LSCO), a Pt/LSCO stacked structure and YBa$_2$Cu$_3$O$_7$. In the above chemical formulae, the value of X satisfies $0\leq X<2$. In the above stacked structures, a material positioned after "/" is in contact with the ferroelectric layer. The first electrode and the second electrode may be formed of one material, materials of the same kind or materials of different kinds. For forming the first electrode or the second electrode, a first electrically conductive material layer or a second electrically conductive material layer is formed, and in a step to come thereafter, the first electrically conductive material layer or the second electrically conductive material layer is patterned. The first electrically conductive material layer or the second electrically conductive material layer can be formed by a method properly suitable for the materials for constituting the first electrically conductive material layer or the second electrically conductive material layer, such as a sputtering method, a reactive sputtering method, an electron beam deposition method, an MOCVD method or a pulse laser abrasion method. The first electrically conductive material layer or the second electrically conductive material layer can be patterned, for example, by an ion milling method or an RIE method.

In the nonvolatile memory of the present invention, further, when the first electrode is formed below the ferroelectric layer and when the second electrode is formed on the ferroelectric layer, the first electrode constituting the memory cell preferably has a so-called damascene structure. When the first electrode is formed on the ferroelectric layer and when the second electrode is formed below the ferroelectric layer, the second electrode constituting the memory cell preferably has a so-called damascene structure. That is because the ferroelectric layer can be formed on a flat substratum.

In the present invention, the material for constituting the insulating interlayer includes silicon oxide (SiO$_2$), silicon nitride (SiN), SiON, SOG, NSG, BPSG, PSG, BSG and LTO.

The transistor for selection (transistor for switching) and various transistors formed in a semiconductor substrate below the memory cells through an insulating layer can be constituted, for example, of a known MIS type FET or MOS type FET. The material for the bit line includes polysilicon doped with an impurity or a refractory metal material. The common first electrode and the transistor for selection can be electrically connected to each other through a contact hole made through the insulating layer interposed between the common first electrode and the transistor for selection or can be electrically connected through a contact hole made through the insulating layer and a wiring layer formed on the insulating layer. Examples of the material for the insulating layer include silicon oxide (SiO$_2$), silicon nitride (SiN), SiON, SOG, NSG, BPSG, PSG, BSG and LTO.

In the nonvolatile memory according to any one of the first to fourth aspects of the present invention, practically, there can be employed a constitution in which such nonvolatile memories are combined as a pair (to be called "nonvolatile memory-A" and "nonvolatile memory-B" for the sake of convenience), and the bit lines constituting the pair of the nonvolatile memories are connected to one sense amplifier. In this case, the transistor for selection constituting the nonvolatile memory-A and the transistor for selection constituting the nonvolatile memory-B may be connected to one word line or different word lines. Depending upon the constitution and operation method of the nonvolatile memory-A and the nonvolatile memory-B, 1 bit can be stored in each of the memory cells constituting the nonvolatile memory-A or the nonvolatile memory-B, or one memory cell constituting the nonvolatile memory-A and one memory cell constituting the nonvolatile memory-B and being connected to the plate line to which the above memory cell constituting the nonvolatile memory-A is connected can be combined as a pair so that complementary data can be stored in the pair of such memory cells.

BEST MODE FOR CARRYING OUT THE INVENTION

The present invention will be explained on the basis of Examples with reference to drawings.

EXAMPLE 1

Figure 1:
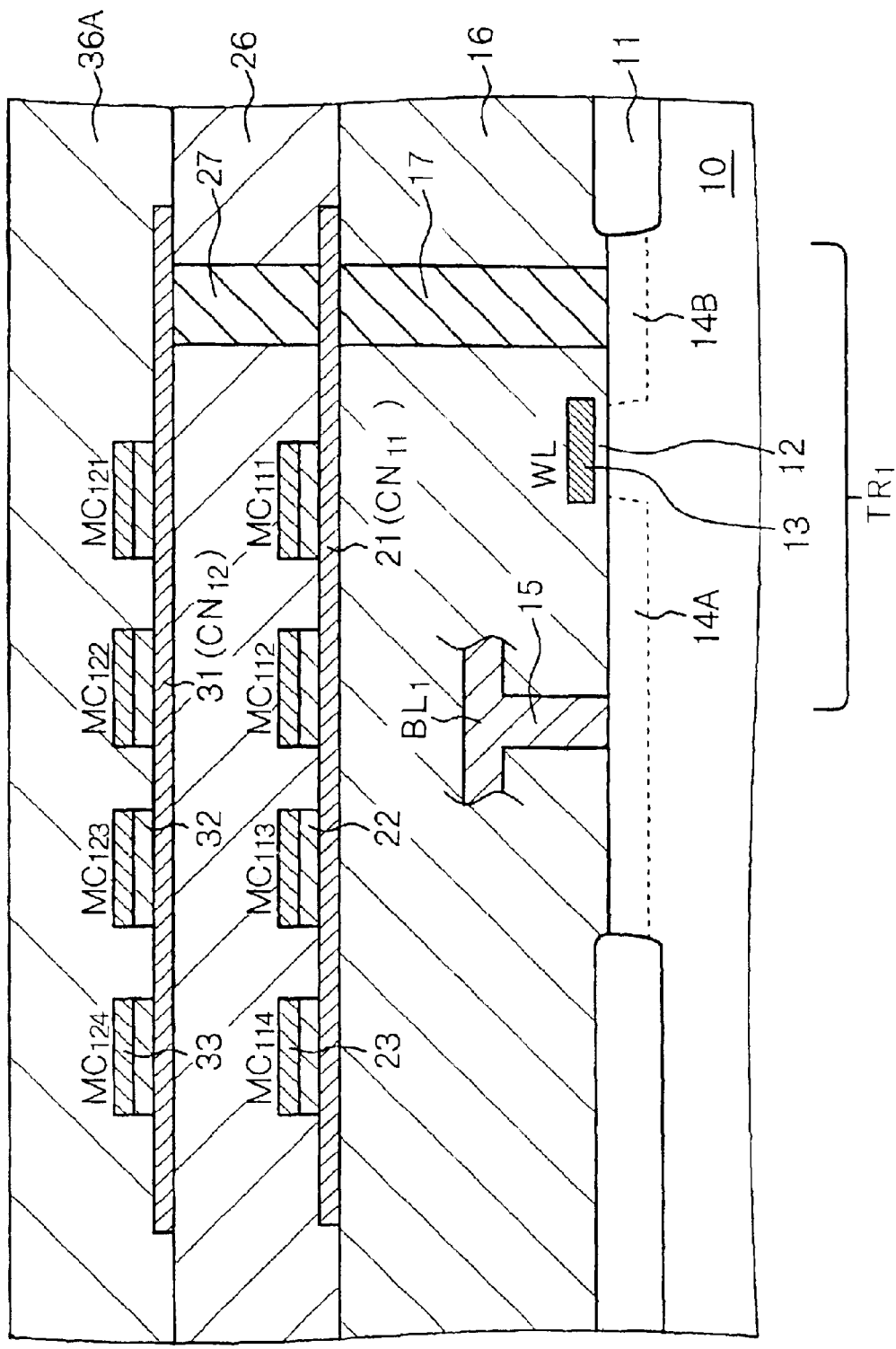
FIG. 1 is a schematic partial cross-sectional view of a ferroelectric-type nonvolatile semiconductor memory in Example 1, taken by cutting it with an imaginary plane in parallel with the extending direction of a bit line.
Figure 2A:
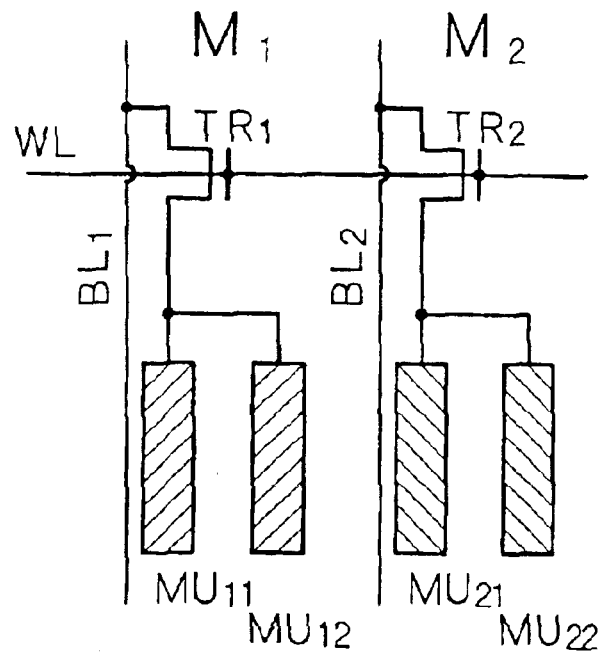
FIGS. 2A and 2B are conceptual circuit diagrams of nonvolatile memories according to the second aspect of the present invention.
Figure 2B:
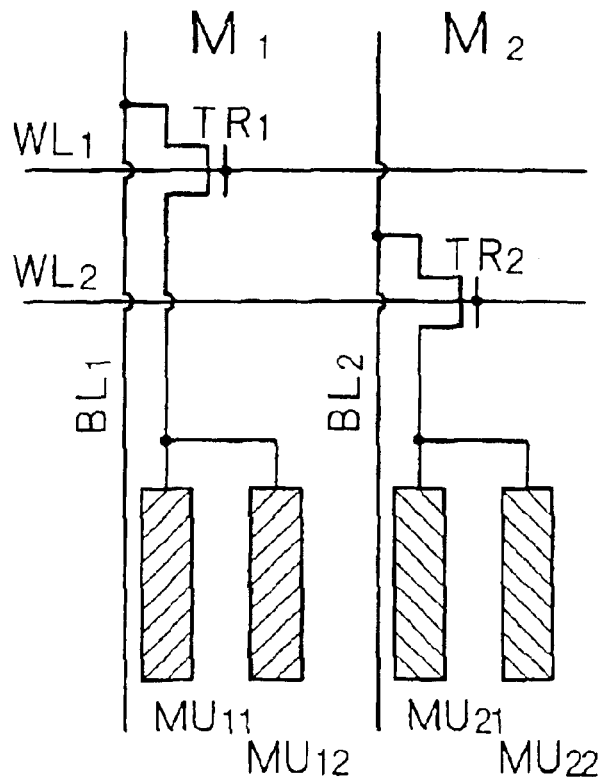
Figure 3:
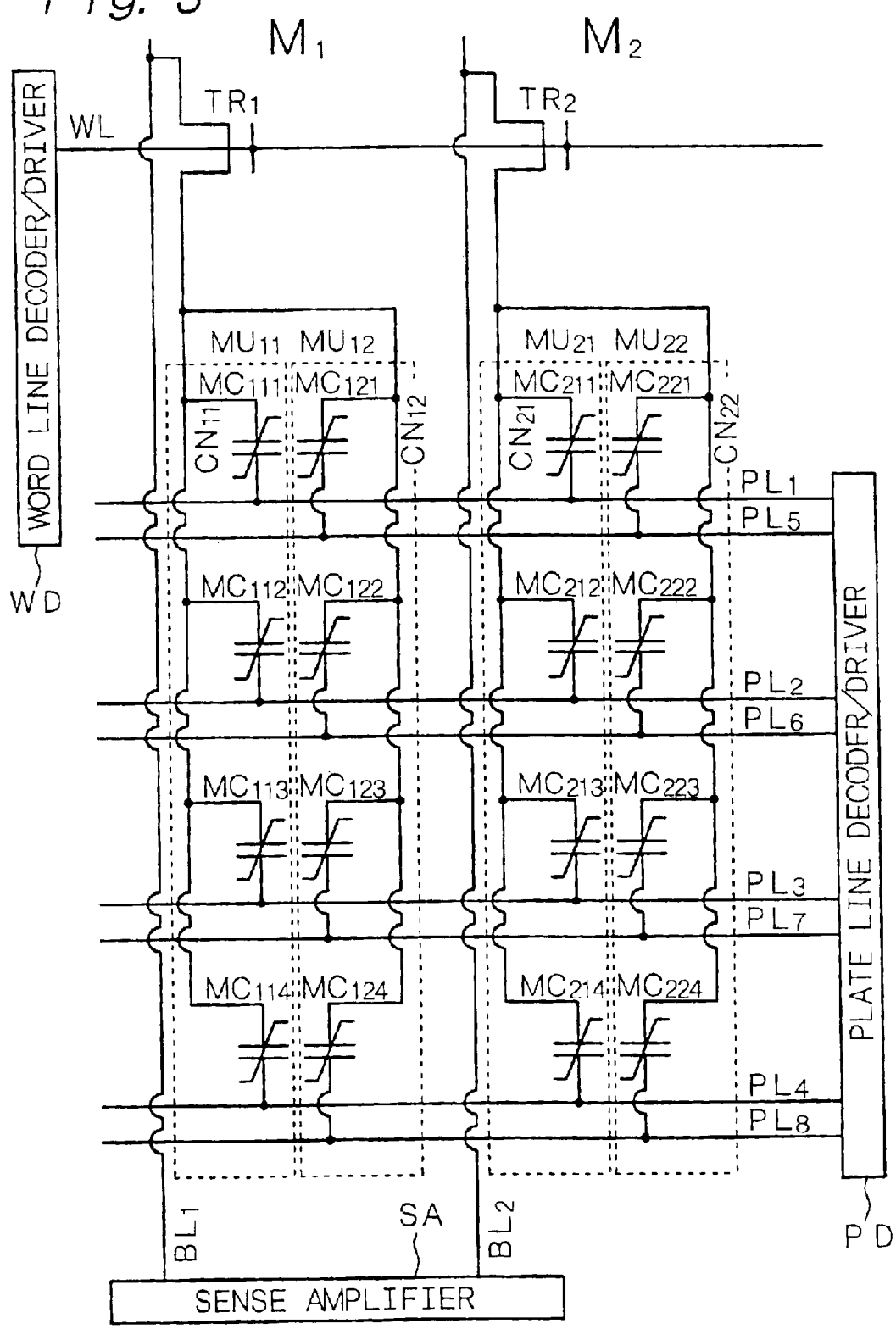
FIG. 3 is a more specific circuit diagram of the conceptual circuit diagram shown in FIG. 2A.
Figure 4:
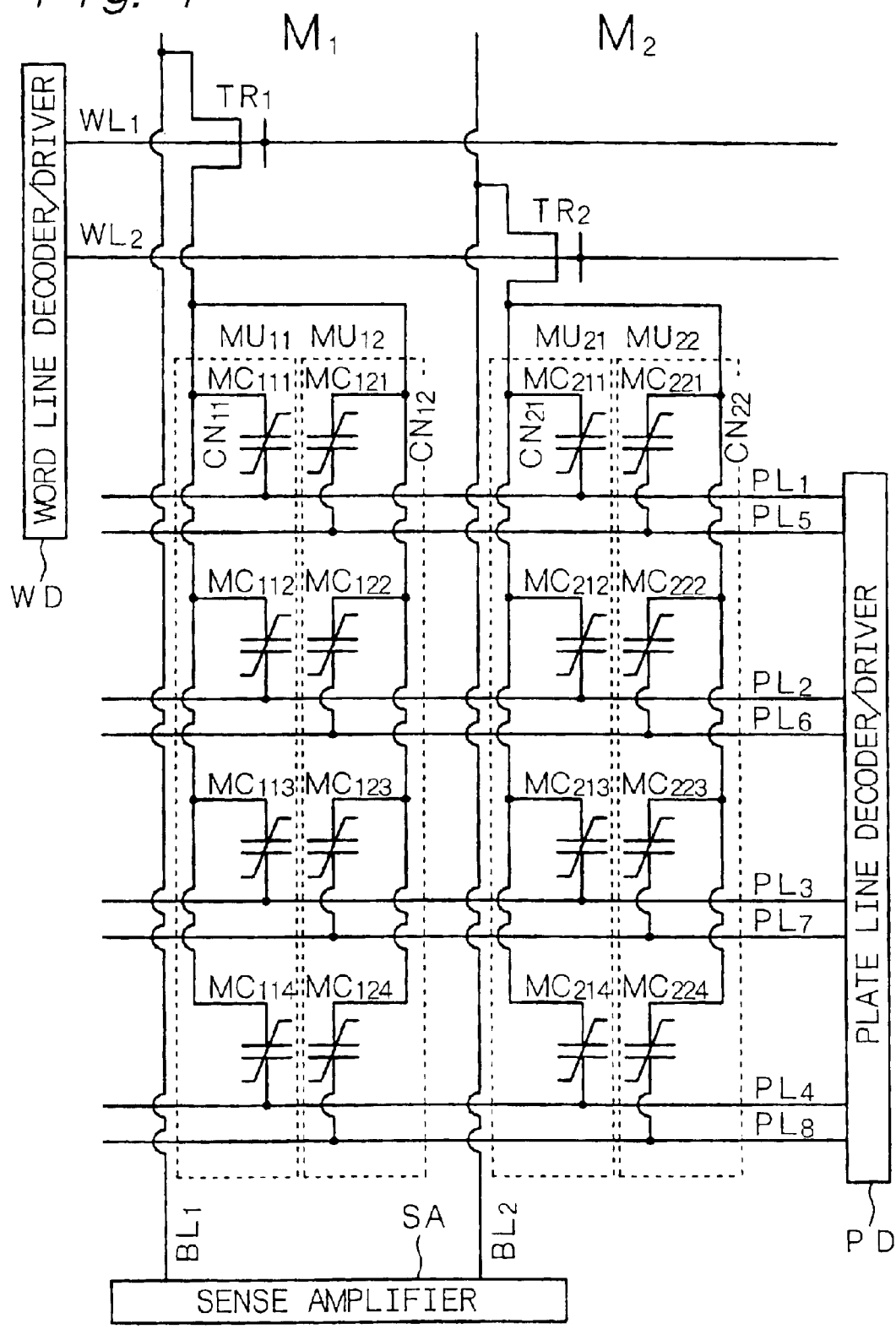
FIG. 4 is a more specific circuit diagram of the conceptual circuit diagram shown in FIG. 2B.

Example 1 is concerned with the ferroelectric-type nonvolatile semiconductor memory (to be called "nonvolatile memory" for short hereinafter) according to the first and second aspects of the present invention. FIG. 1 shows a schematic partial cross-sectional view of the nonvolatile memory taken by cutting it with an imaginary plane in parallel with the extending direction of a bit line. Further, FIGS. 2A and 2B show conceptual circuit diagrams of the nonvolatile memory according to the second aspect of the present invention, FIG. 3 shows a more specific circuit diagram of the conceptual circuit diagram shown in FIG. 2A, and FIG. 4 shows a more specific circuit diagram of the conceptual circuit diagram shown in FIG. 2B. FIGS. 3 and 4 show two nonvolatile memories $M_1$ and $M_2$. Since, however, these nonvolatile memories $M_1$ and $M_2$ are structurally the same as each other, the nonvolatile memory $M_1$ alone will be explained below.

The nonvolatile memory $M_1$ of Example 1 comprises;

(A) a bit line $BL_1$, (B) a transistor for selection $TR_1$, (C) memory units $MU_1$ and $MU_2$ composed of memory cells $MC_{111}$–$MC_{114}$ and $MC_{121}$–$MC_{124}$ that are M' in number (M'≧2, and M'=8 in Example 1), and (D) plate lines that are M' in number.

Each memory cell comprises a first electrode 21 or 31, a ferroelectric layer 22 or 32, and a second electrode 23 or 33. In the memory unit, the first electrodes 21 or 31 of the memory cells are in common, and the common first electrode 21 or 31 is connected to the bit line $BL_1$ through the transistor for selection $TR_1$. In the memory unit, the second electrode 23 or 33 of the m'-th-place (m'=1, 2 . . . , M') memory cell is connected to the m'-th-place plate line.

In other words, the nonvolatile memory $M_1$ of Example 1 comprises;

(A) a bit line $BL_1$, (B) a transistor for selection $TR_1$, (C) memory units $MU_{1N}$ that are N in number (N≧2, and N=2 in Example 1), each memory unit being composed of memory cells $MC_{1NM}$ that are M in number (M≧2, and M=4 in Example 4), and (D) plate lines that are M×N in number.

The memory units $MU_{1N}$ that are N in number are stacked through an insulating interlayer 26, and each memory cell comprises a first electrode 21 or 31, a ferroelectric layer 22 or 32, and a second electrode 23 or 33. In each memory unit $MU_{1N}$, the first electrodes 21 of the memory cells $MC_{1NM}$ are in common, and the common first electrode is connected to the bit line $BL_1$ through the transistor for selection $TR_1$. Specifically, in the memory unit $MU_{11}$, the first electrodes 21 of the memory cells $MC_{11M}$ are in common (the common first electrode will be referred to as "first common node $CN_{11}$"), and the common first electrode 21 (first common node $CN_{11}$) is connected to the bit line $BL_1$ through the transistor for selection $TR_1$. In the memory unit $MU_{12}$, further, the first electrodes 31 of the memory cells $MC_{12M}$ are in common (the common first electrode will be referred to as "second common node $CN_{12}$"), and the common first electrode 31 (second common node $CN_{12}$) is connected to the bit line $BL_1$ through the transistor for selection $TR_1$. Further, in the memory unit $MU_{1n}$ of the n-th layer (n=1, 2 . . . , N), the second electrode 23 or 33 of the m-th-place (m=1, 2 . . . , M) memory cell $MC_{1nm}$ is connected to the [(n−1M+m]-th-place plate line $PL_{(n-1)M+m}$. The plate line $PL_{(n-1)M+m}$ is also connected to the second electrode 23 or 33 of each memory cell constituting the nonvolatile memory $M_2$. In Example 1, more specifically, each plate line is extending from the second electrode 23 or 33 and is connected in a region that is not shown.

The ferroelectric layer 22 or 32 constituting each memory cell is composed of lead titanate zirconate [Pb($Zr_X$,$Ti_Y$)$O_3$], and the lead titanate zirconate has a composition that satisfies 0.6<Y/(X+Y)≦0.9.

One source/drain region 14A of the transistor for selection $TR_1$ is connected to the bit line $BL_1$, and the other source/drain region 14B of the transistor for selection $TR_1$ is connected to the common first electrode 21 (first common node $CN_{11}$) in the memory unit $MU_{11}$ of the first layer through a contact hole 17 of a first layer formed in an insulating layer 16. Further, the other source/drain region 14B of the transistor for selection $TR_1$ is connected to the common first electrode 31 (second common node $CN_{12}$) in the memory unit $MU_{12}$ of the second layer through the contact hole 17 of the first layer formed in the insulating layer 16 and a contact hole 27 formed in the insulating interlayer 26. In FIG. 1, reference numeral 36A indicates an insulation layer.

The bit line $BL_1$ is connected to a sense amplifier SA. Further, the plate line $PL_{(n-1)M+m}$ is connected to a plate line decoder/driver PD. A word line WL (or word lines $WL_1$ and $WL_2$) is connected to a word line decoder/driver WD. The word line WL is extending in the direction perpendicular to the paper surface of FIG. 1. Further, the second electrode 23 of the memory cell $MC_{11m}$ constituting the nonvolatile memory $M_1$ is common to the second electrode of the memory cell $MC_{21m}$ constituting the nonvolatile memory $M_2$ that is adjacent to the nonvolatile memory $M_1$ in the direction perpendicular to the paper surface of FIG. 1, and works as the plate line $PL_{(n-1)M+m}$. Further, the second electrode 33 of the memory cell $MC_{12}m$ constituting the nonvolatile memory $M_1$ is common to the second electrode of the memory cell $MC_{22m}$ constituting the nonvolatile memory $M_2$ that is adjacent to the nonvolatile memory $M_1$ in the direction perpendicular to the paper surface of FIG. 1, and works as the plate line $PL_{(n-1)M+m}$. Further, the word line WL is common to the transistor for selection $TR_1$ constituting the nonvolatile memory $M_1$ and the transistor for selection $TR_2$ constituting the nonvolatile memory $M_2$ that is adjacent to the nonvolatile memory $M_1$ in the direction perpendicular to the paper surface of FIG. 1.

In the nonvolatile memories $M_1$ and $M_2$ whose circuit diagrams are shown in FIG. 2A and FIG. 3, the transistors for selection $TR_1$ and $TR_2$ constituting the nonvolatile memories $M_1$ and $M_2$ are connected to the same word line WL. And, complementary data is stored in a pair of the memory cells $MC_{1nm}$ and $MC_{2nm}$ (n=1, 2 . . . , N and m=1, 2 . . . M). For example, when data stored in the memory cells $MC_{1nm}$ and $MC_{2nm}$ (m is one of 1, 2, 3 and 4) is read out, the word line WL is selected, and a voltage, for example, of (⅓) $V_{cc}$ is applied to the plate lines $PL_j$ (m≠j). In this state, the plate line $PL_{(n-1)M+m}$ is driven. The above $V_{cc}$ is, for example, a power source voltage. In this manner, the complementary data appears, as voltages (bit line, potentials), on a pair of the bit lines $BL_1$ and $BL_2$ from the memory cells $MC_{1nm}$ and $MC_{2nm}$ through the transistors for selection $TR_1$ and $TR_2$. And, the voltages (bit line potentials) on the above pair of the bit lines $BL_1$ and $BL_2$ are detected with the sense amplifier SA. Alternatively, the transistors for selection $TR_1$ and $TR_2$ constituting the nonvolatile memory $M_1$ and $M_2$ are connected to different word lines $WL_1$ and $WL_2$, respectively, the memory cells $MC_{1nm}$ and $MC_{2nm}$ are independently controlled, and a reference voltage is applied to one of the pair of the bit lines $BL_1$ and $BL_2$, whereby data can be read out from each of the memory cells $MC_{1nm}$ and $MC_{2nm}$. For circuit diagrams for employing the above constitution, see FIG. 2B and FIG. 4. When the transistors for selection $TR_1$ and $TR_2$ are simultaneously driven, a circuit for such is equivalent to the circuit shown in FIG. 2A and FIG. 3. As described above, 1 bit as data is stored in each of the memory cells $MC_{1nm}$ and $MC_{2nm}$ (n=1, 2 and m=1, 2, 3, 4) (see FIG. 2B and FIG. 4), or the complementary data as 1 bit is stored in a pair of the memory cells $MC_{1nm}$ and $MC_{2nm}$ (see FIG. 2A and FIG. 3). In an actual nonvolatile memory, sets of the above memory units for storing 16 bits or 8 bits each are arranged as access units in the form of an array. The value of M is not limited to 4. The value of M may be any number so long as it satisfies M≧2, and examples of the value of M practically include exponent numbers of 2 (2, 4, 8, 16 . . . ). Further, the value of N may be any number so long as it satisfies N≧2, and examples of the value of N practically include exponent numbers of 2 (2, 4, 8, . . . ).

The process for the production of the nonvolatile memory of Example 1 will be explained below. Nonvolatile memories in other Examples can be also produced by substantially the same process.

[Step-100]

First, a MOS transistor that works as the transistor for selection in the nonvolatile memory is formed in the semiconductor substrate 10. For this purpose, a device-isolation region 11 having, for example, a LOCOS structure is formed by a known method. The device-isolation region may have a trench structure or may be formed of a combination of a LOCOS structure and a trench structure. Then, the surface of the semiconductor substrate 10 is oxidized, for example, by a pyrogenic oxidation method to form the gate insulating film 12. Then, an impurity-doped polysilicon layer is formed on the entire surface by a CVD method, and then the polysilicon layer is patterned to form the gate electrode 13. The gate electrode 13 also works as a word line. The gate electrode 13 may be constituted of a polycide or a metal silicide in place of the polysilicon layer. Then, the semiconductor substrate 10 is implanted with an ion to form an LDD structure. Then, an $SiO_2$ layer is formed on the entire surface by a CVD method and then etched back to form a gate sidewall (not shown) on sides of the gate electrode 13. Then, the semiconductor substrate 10 is implanted with an ion, and an impurity implanted is activated by annealing, to form the source/drain regions 14A and 14B.

[Step-110]

Then, a lower insulating layer made of $SiO_2$ is formed by a CVD method, and then, an opening portion is formed in the lower insulating layer above one source/drain region 14A by an RIE method. Then, a polysilicon layer doped with an impurity is formed on the lower insulating layer and the inside of the opening portion by a CVD method, whereby the contact hole 15 is formed. Then, the polysilicon layer on the lower insulating layer is patterned to form the bit lines $BL_1$. Then, an upper insulating layer made of BPSG is formed on the entire surface by a CVD method. After the formation of the upper insulating layer made of BPSG, preferably, the upper insulating layer is re-flowed in a nitrogen atmosphere, for example, at 900° C. for 20 minutes. Further, desirably, the top surface of the upper insulating layer is chemically and mechanically polished by a chemical/mechanical polishing method (CMP method) to flatten the upper insulating layer as required. The lower insulating layer and the upper insulating layer will be together referred to as insulating layer 16.

[Step-120]

Then, an opening portion is made in the insulating layer 16 above the other source/drain region 14B by an RIE method, and then the opening portion is filled with polysilicon doped with an impurity, to complete the contact hole (contact plug) 17. The bit line $BL_1$ is extending on the lower insulating layer leftward and rightward in the drawing without being in contact with the contact hole 17.

The contact hole 17 may be also formed by filling the opening portion made in the insulating layer 16 with a metal wiring material of a refractory metal or a metal silicide such as tungsten, Ti, Pt, Pd, Cu, TiW, TiNW, $WSi_2$ or $MoSi_2$. Preferably, the top surface of the contact hole 17 may be present nearly at the level of the surface of the insulating layer 16. The following Table 1 shows conditions of filling the opening portion with tungsten to form the contact hole 17. Before filling the opening portion with tungsten, preferably, a Ti layer and a TiN layer are consecutively formed on the insulating layer 16 and the inside of the opening portion, for example, by a magnetron sputtering method. The Ti layer and the TiN layer are formed for attaining an ohmic low contact resistance, preventing damage of the semiconductor substrate 10 in the blanket tungsten CVD method and improving the adhesion of tungsten.

TABLE 1

| Sputtering Conditions of Ti layer (thickness: 20 nm) | |
| --- | --- |
| Process gas | Ar = 35 sccm |
| Pressure | 0.52 Pa |
| RF power | 2 kW |
| Heating of substrate | No |

TABLE 1-continued

| Sputtering conditions of TiN layer (thickness: 100 nm) | |
| --- | --- |
| Process gas | $N_2$/Ar = 100/35 sccm |
| Pressure | 1.0 Pa |
| RF power | 6 kw |
| Heating of substrate | No |
| CVD Condition of formation of tungsten | |
| Gas | $WF_6/H_2$/Ar = 40/400/2250 sccm |
| Pressure | $10.7 \times 10^3$ Pa |
| Forming temperature | 450° C. |
| Conditions of etching tungsten layer, TiN layer and Ti layer | |
| Etching at first stage: Etching of tungsten layer | |
| Gas | $SF_6$/Ar/He = 110/90/5 sccm |
| Pressure | 46 Pa |
| RF power | 275 W |
| Etching at second stage: Etching of TiN layer/Ti layer | |
| Gas | Ar/$Cl_2$ = 75/5 sccm |
| Pressure | 6.5 Pa |
| RF power | 250 W |

[Step-130]

Then, desirably, an adhesion layer (not shown) made of titanium nitride (TiN) is formed on the insulating layer 16. Then, a first electrically conductive material layer for constituting the first electrode (lower electrode) 21 made of Ir is formed on the adhesion layer, for example, by a sputtering method, and the first electrically conductive material layer and the adhesion layer are patterned by photolithographic and dry-etching techniques, whereby the first electrode 21 in the form of a stripe can be obtained. Then, an $SiO_2$ film or an $SiO_2/TiO_2$ film (not shown) is formed on the entire surface by a CVD method, and the film is flatted by a CMP method, whereby there can be obtained a state where the film is filled between the first electrodes 21 (so-called damascene structure). The CMP method can be carried out using an alumina-containing slurry as a polishing agent.

A first electrode having a so-called damascene structure can be also formed as follows. For example, an SiN film is formed on the insulating layer 16, then, the SiN film in a portion where the first electrode is to be formed is selectively removed, the adhesion layer and the first electrically conductive material layer are formed on the SiN film and an exposed insulating layer 16, and then the first electrically conductive material layer and the adhesion layer on the SiN film are removed by a CMP method.

[Step-140]

Then, a ferroelectric thin film made of PZT is formed on the entire surface, and then the ferroelectric thin film is patterned, to form the ferroelectric layer 22.

[Step-150]

Then, an Ir layer is formed on the entire surface by a sputtering method, and then patterned by photolithographic and dry-etching techniques, to form the second electrode 23 on the ferroelectric layer 22 and the plate line PL extending from the second electrode 23. When the etching damages the ferroelectric layer 22, then, damage-recovering annealing can be carried out at a temperature suitable for recovery from the damage.

[Step-160]

Then, the following procedures are consecutively carried out.

Formation and flattening of the insulating interlayer 26.
Formation of the opening portion and formation of the contact hole 27.
Formation of the first electrode 31 having, for example, a damascene structure.
Formation of the ferroelectric layer 32 made of PZT.

Formation of the second electrode 33.

Formation of the insulation layer 36A.

The ferroelectric layers 22 and 32 made of PZT can be formed by any one of sputtering methods such as a magnetron sputtering method and a reactive sputtering method; a pulse laser abrasion method; an electron beam deposition method; solution chemical deposition methods (sol-gel method) such as a spraying method and a spin-coating method; and an MOCVD method. The following Tables show conditions of forming PZT by a magnetron sputtering method, a pulse laser abrasion method, a sol-gel method and an MOCVD method.

TABLE 2

[Magnetron sputtering method]

| | |
|---|---|
| Target | PZT (composition satisfying $0.6 < Y/(X + Y) \leq 0.9$ |
| Process gas | $Ar/O_2$ = 90 vol %/10 vol % |
| Pressure | 0.35 Pa |
| Power | 2 kW |
| Forming temperature | Room temperature |

TABLE 3

[Pulse laser abrasion method]

| | |
|---|---|
| Target | PZT (composition satisfying $0.6 < Y/(X + Y) \leq 0.9$ |
| Laser | KrF Excimer laser (wavelength 248 nm, pulse width 25 nanosecond, 3 Hz) |
| Output energy | 400 mJ (1.1 J/cm$^2$) |
| Forming temperature | Room temperature |
| Oxygen concentration | 40–120 Pa |

TABLE 4

[Sol-gel method]

| | |
|---|---|
| Sol-gel solution | Pb(OAc)$_2$, Ti(O—i-Pr)$_4$ and Zr(O—n-Bu)$_4$ 2-methoxyethanol (solvent), (composition satisfying $0.6 < Y/(X + Y) \leq 0.9$) |
| Application condition | Number of rotation 3000 rpm |
| Preliminary firing | 450° C. × 30 minutes |
| Number of times of application | 4 times |
| Crystallization temperature | 650° C. |

TABLE 5

[MOCVD method]

| | |
|---|---|
| Raw materials | Pb(DPM)$_2$/THF, Ti(i-OC$_3$H$_7$)$_2$(DPM)$_2$/THF, Zr(DIBM)$_4$/THF |
| Process gas | Ar/O$_2$ = 70/30 |
| Pressure | 2.7 × 10$^3$ Pa |
| Forming temperature | 550° C. |

Nonvolatile memory samples provided with ferroelectric layers having PZT compositions (X,Y)=(52,48), (X,Y)=(40, 60), (X,Y)=(30,70), (X,Y)=(20,80) and (X,Y)=(10,90) were prepared under conditions shown in Table 4. For comparison, a nonvolatile memory sample provided with a ferroelectric layer formed of SBT (SrBi$_2$Ta$_2$O$_9$) was prepared by a sol-gel method. The PZT crystallization temperature was set at 650° C., and the SBT crystallization temperature was set at 750° C.

Figure 5:
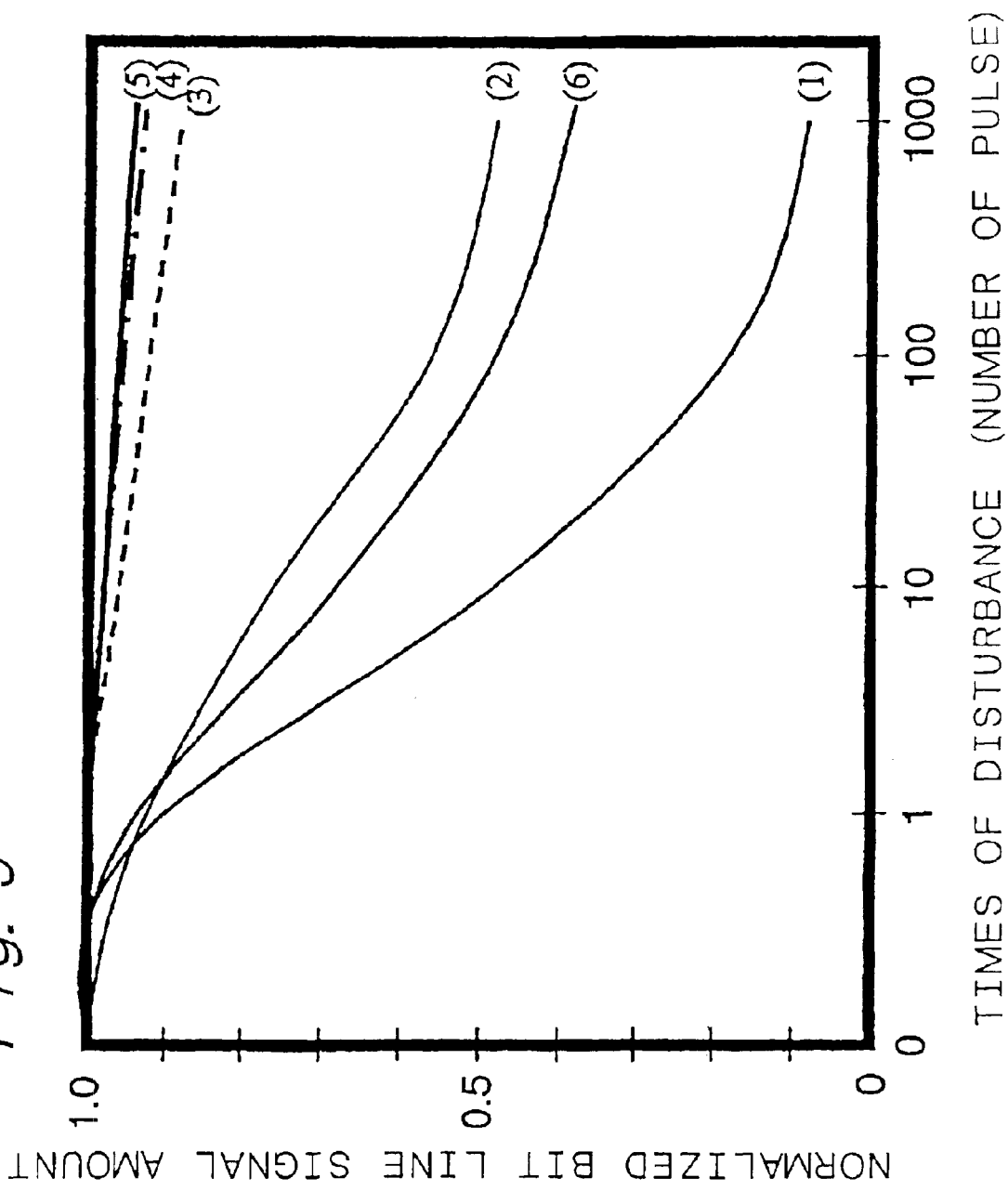
FIG. 5 is a graph showing results of evaluation of disturbance durability of various ferroelectric-type nonvolatile semiconductor memory samples in Example 1.

Thus-obtained nonvolatile memory samples were evaluated for disturbance durability. FIG. 5 shows the results. In FIG. 5, (1) shows data obtained when (X,Y)=(52,48), (2) shows data obtained when (X,Y)=(40,60), (3) shows data obtained when (X,Y)=(30,70), (4) shows data obtained when (X,Y)=(20,80), (5) shows data obtained when (X,Y)= (10,90), (6) shows data of the nonvolatile memory sample having a ferroelectric layer formed of SBT (SrBi$_2$Ta$_2$O$_9$).

The above evaluation was carried out as follows. Data was written into the memory cell once at a $V_{cc}$ of 3 volt, then, a disturbing pulse (pulse width 100 nanoseconds) of ($\frac{1}{3}$) $V_{cc}$=1 volt was applied a predetermined number of times, and then, data was read out from the memory cell, and a potential $V_1$ appearing on the bit line was measured. In FIG. 5, the axis of abscissas shows number of times of disturbance. The axis of ordinates shows normalized values of $V_1$ based on $V_0$, i.e., values of $V_1/V_0$ (normalized bit line signal amount) in which $V_0$ is a potential appearing on the bit line when data is read out from the memory cell in a non-disturbed state immediately after data is written into the memory cell once.

In (1) [(X,Y)=(52,48)] representing a conventional PZT composition used in a conventional nonvolatile memory or (6) [ferroelectric layer formed of SBT], the value of $V_1/V_0$ decreases to a great extent when the disturbance is imposed approximately 10 times. The practical M value is approximately 8 or 16, so that the number of times of disturbance is 7 times or 15 times. In (2) [(X,Y)=(40,60)], therefore, it cannot be said that the nonvolatile memory has sufficient disturbance durability. In contrast, it can be seen that when the $0.6<Y/(X+Y)\leq0.9$ is satisfied, the nonvolatile memory has high disturbance durability.

Figure 6:
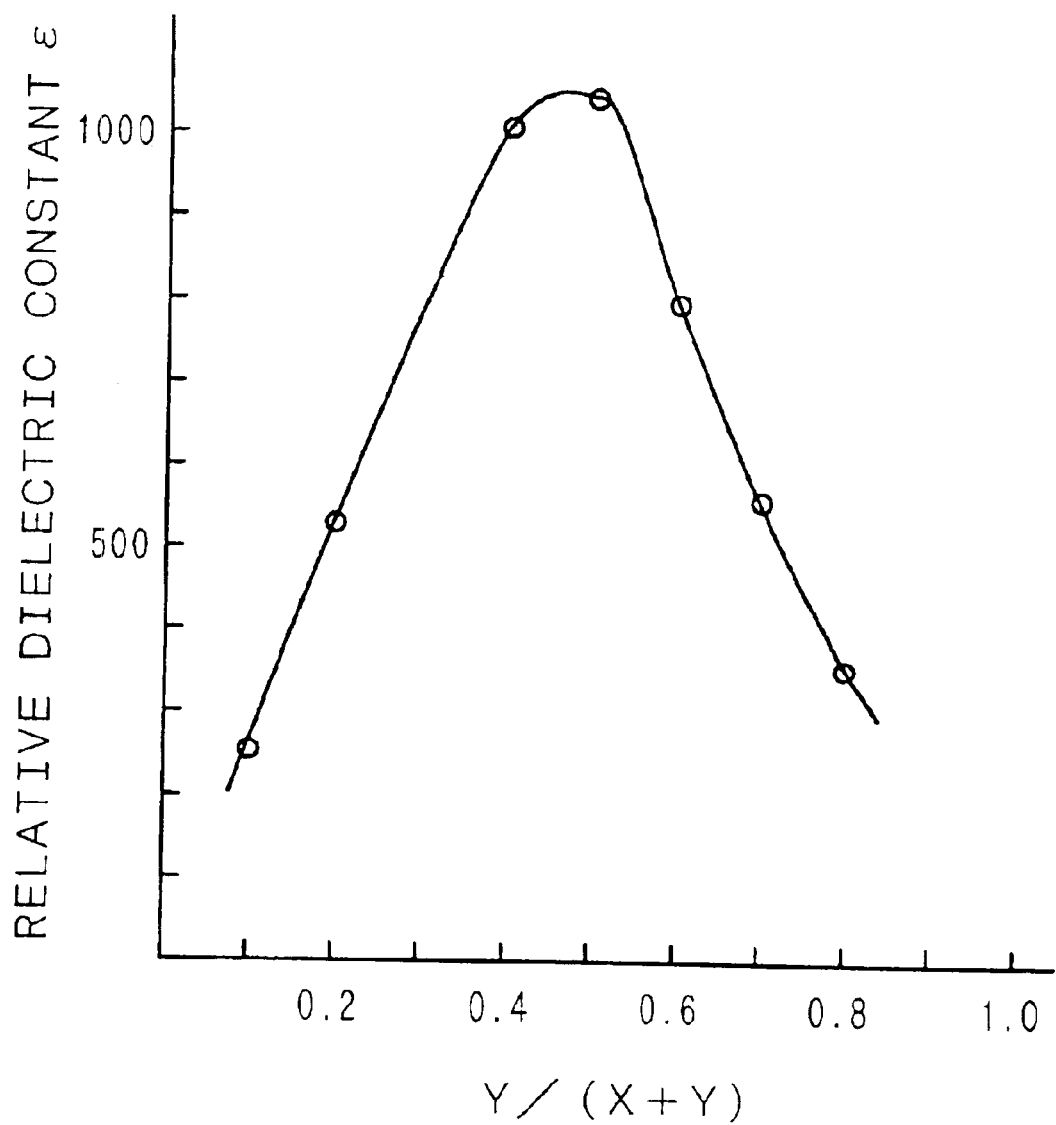
FIG. 6 is a graph showing results of measurement of relative dielectric constants of various ferroelectric-type nonvolatile semiconductor memory samples in Example 1.
Figure 7:
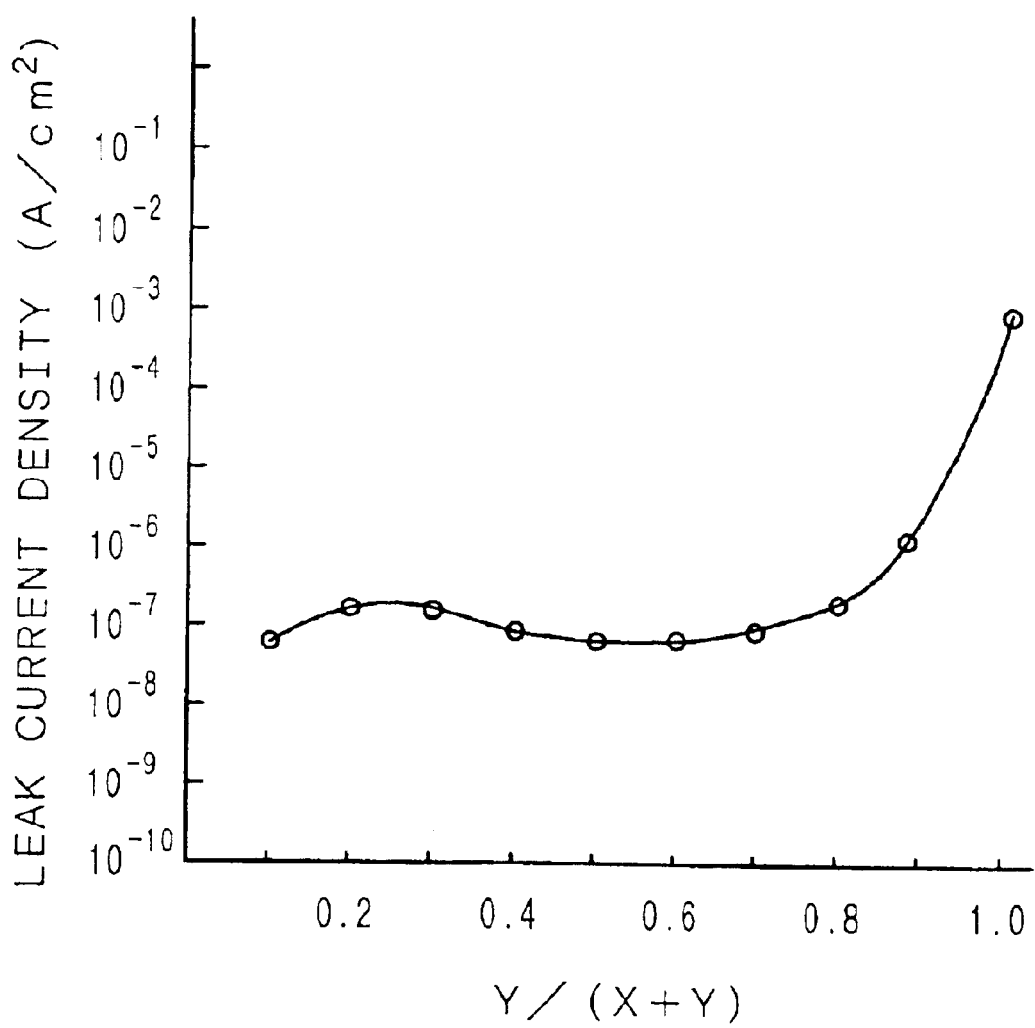
FIG. 7 is a graph showing results of measurement of leak current densities of various ferroelectric-type nonvolatile semiconductor memory samples in Example 1.

In the nonvolatile memory having a structure as explained in Example 1, a smaller value of the relative dielectric constant $\in$ is preferred in view of an improvement in the S/N ratio. FIG. 6 shows results of measurement of the relationship between the value of Y/(X+Y) and the relative dielectric constant $\in$ where the axis of abscissas shows values of Y/(X+Y) and the axis of ordinates shows relative dielectric constant $\in$. Further, FIG. 7 shows results of measurement of the relationship between the value of Y/(X+Y) and the leak current density where the axis of abscissas shows values of Y/(X+Y) and the axis of ordinates shows leak current densities (values after the disturbance is imposed 50 times). It is shown in FIG. 6 that when the value of Y/(X+Y) is 0.5 or more, the relative dielectric constant $\in$ decreases with an increase in the value of Y/(X+Y). It is shown in FIG. 7 that when the value of Y/(X+Y) exceeds 0.9, the leak current density sharply increases. These results also show that it is required to satisfy $0.6<Y/(X+Y)\leq0.9$.

EXAMPLE 2

Figure 8:
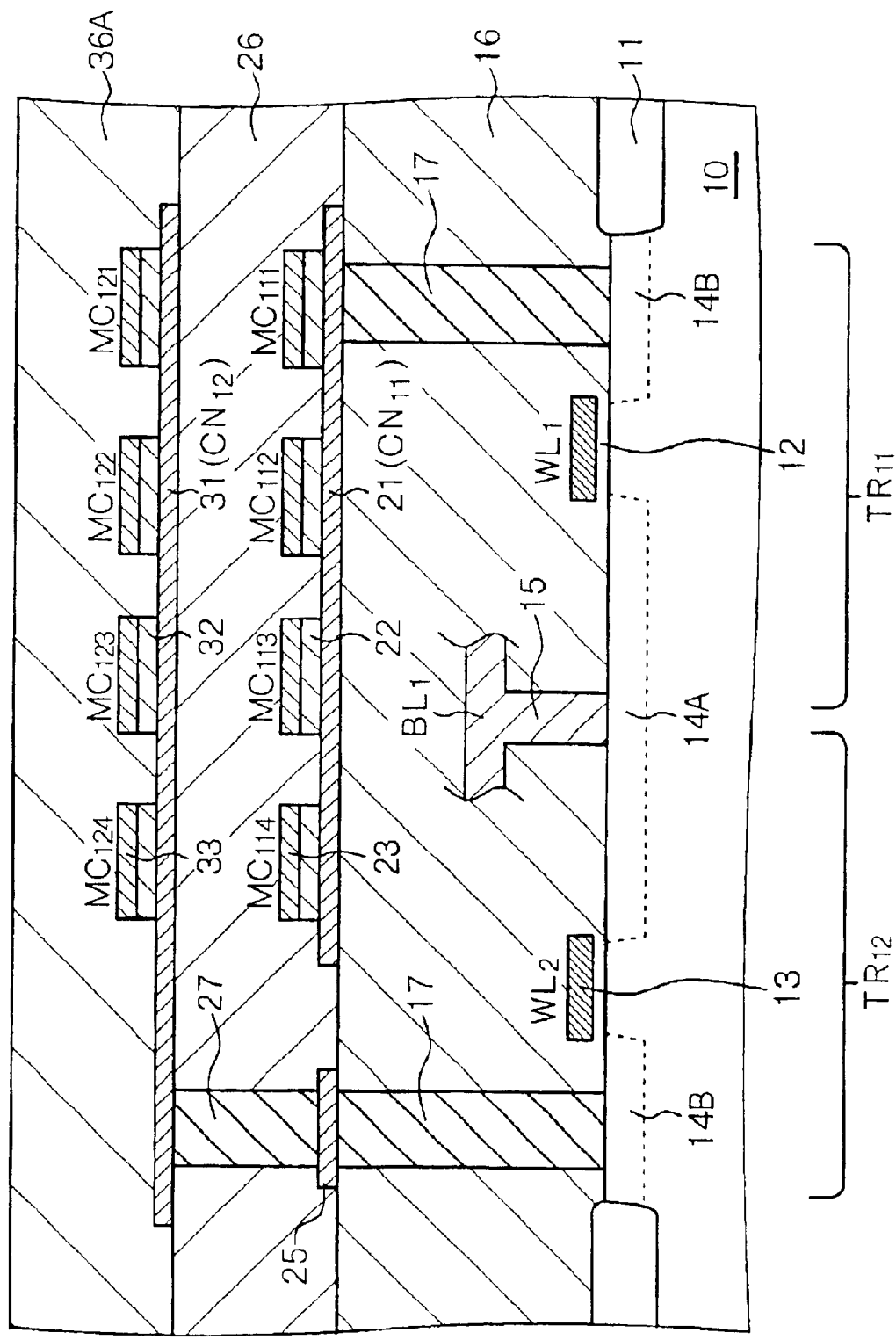
FIG. 8 is a schematic partial cross-sectional view of a semiconductor device including a ferroelectric-type nonvolatile semiconductor memory in Example 2, taken by cutting it with an imaginary plane in parallel with the extending direction of a bit line.
Figure 9A:
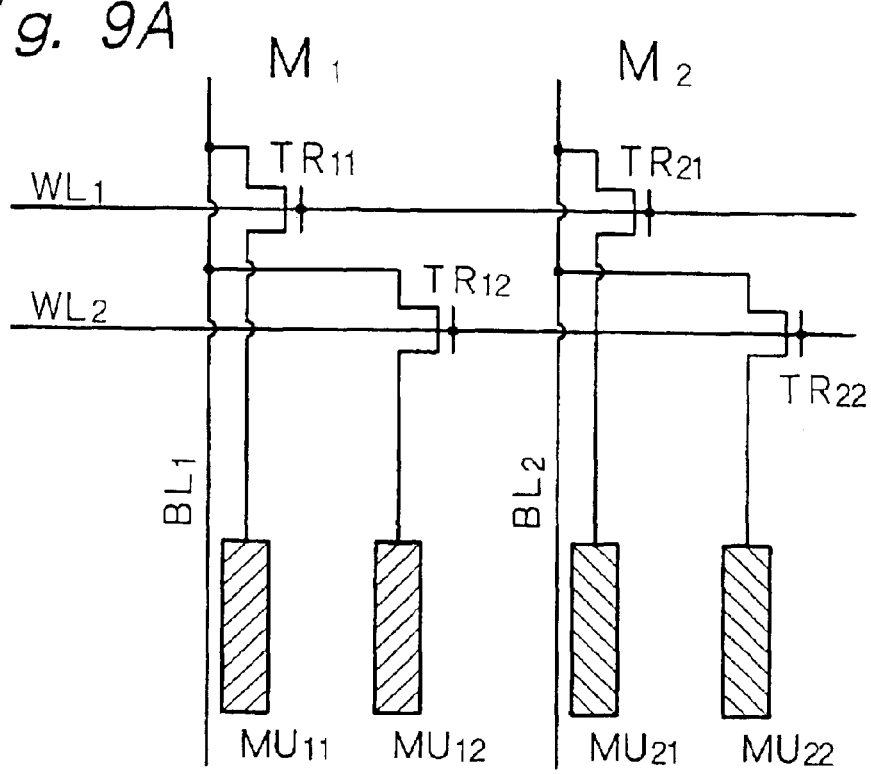
FIGS. 9A and 9B are conceptual circuit diagrams of nonvolatile memories according to the third aspect of the present invention.
Figure 9B:
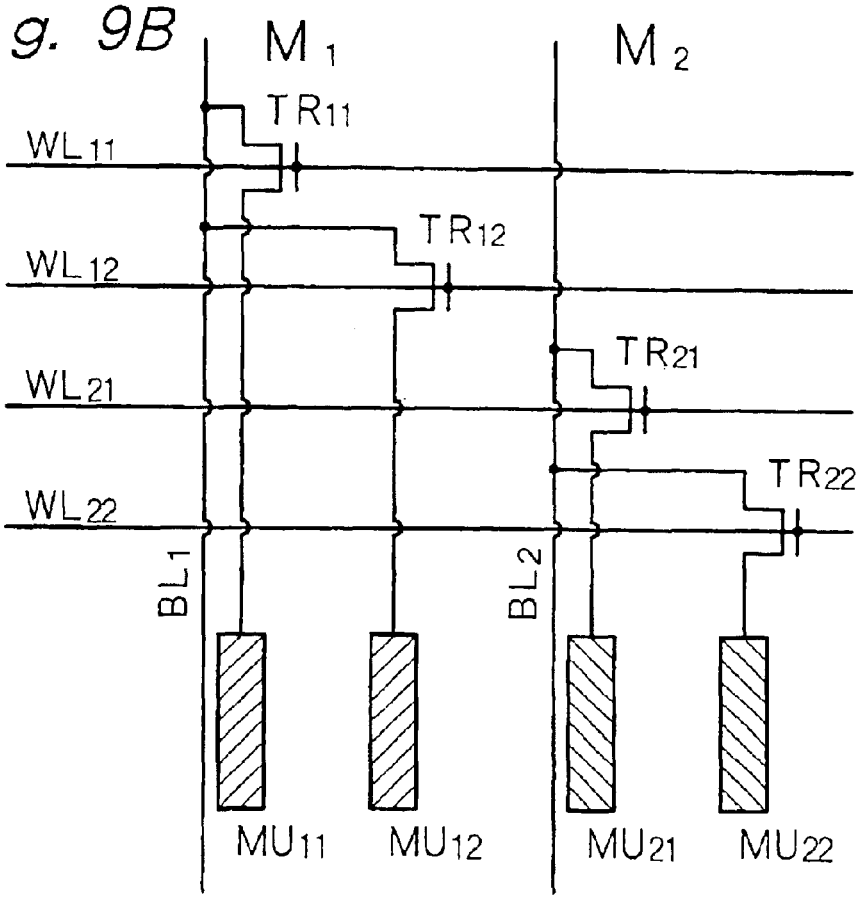
Figure 10:
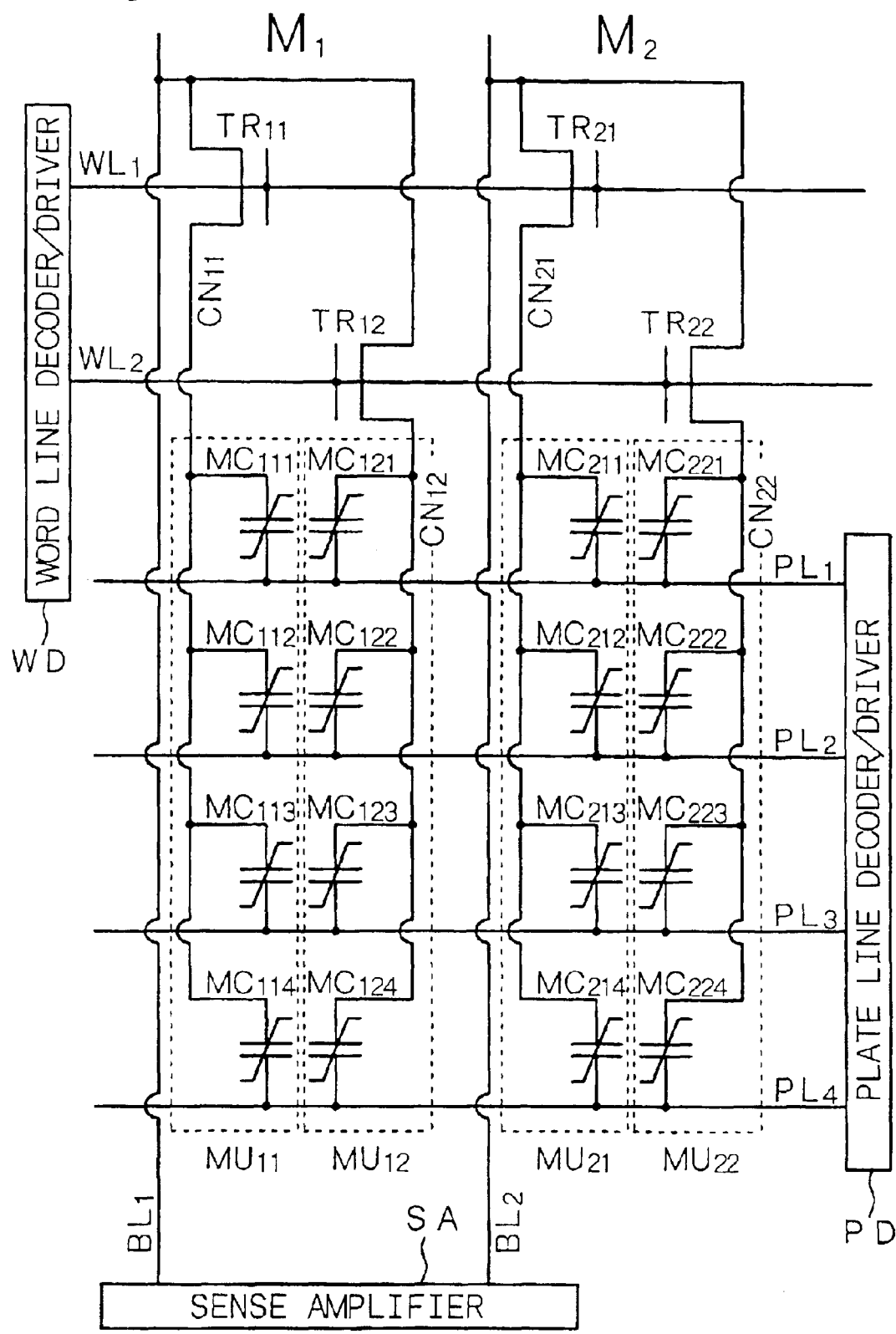
FIG. 10 is a more specific circuit diagram of the conceptual circuit diagram shown in FIG. 9A.
Figure 11:
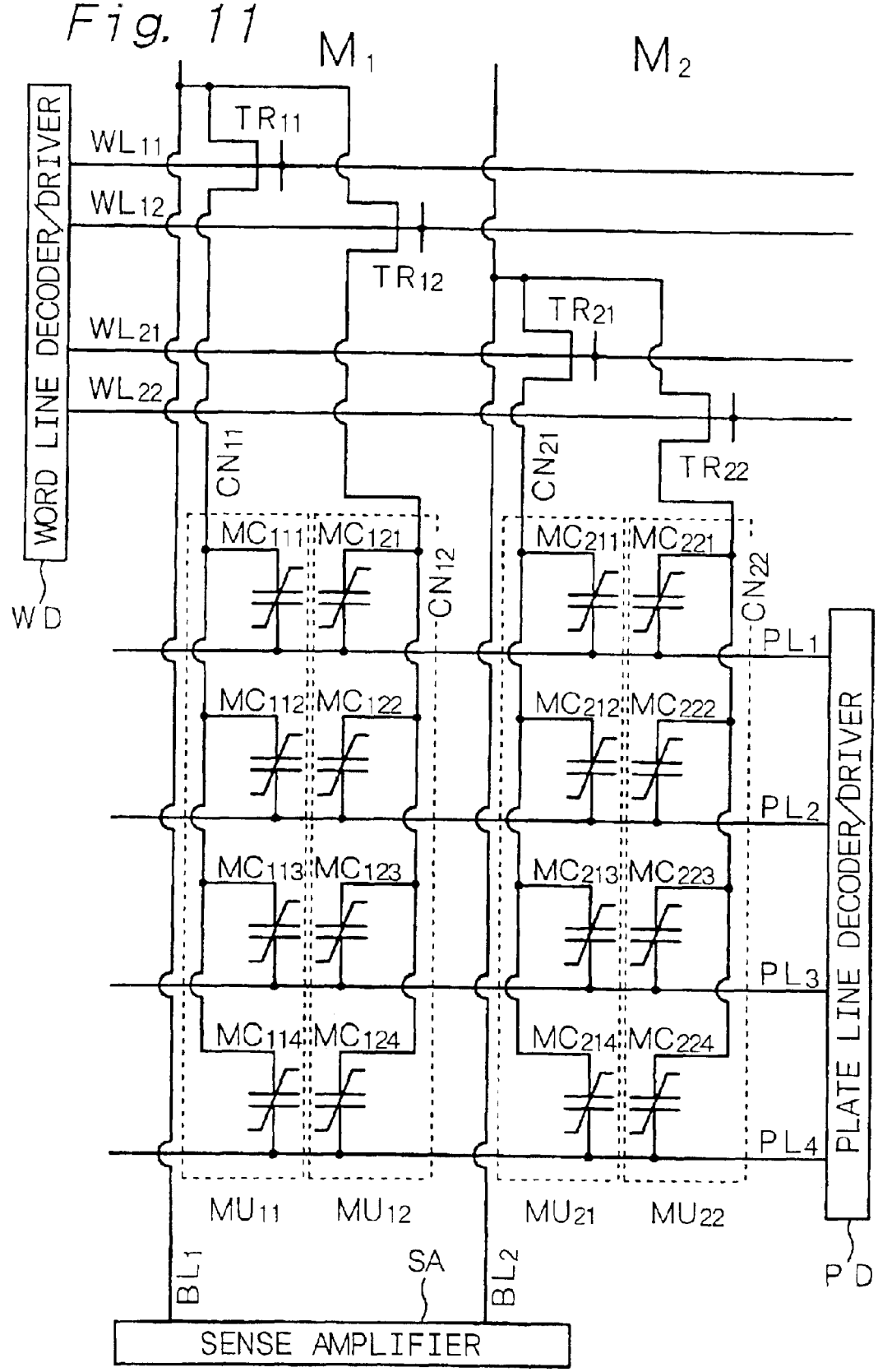
FIG. 11 is a more specific circuit diagram of the conceptual circuit diagram shown in FIG. 9B.

Example 2 is concerned with the nonvolatile memory according to the first and third aspects of the present invention. FIG. 8 shows a schematic partial cross-sectional view of the nonvolatile memory in Example 2, taken by cutting it with an imaginary plane in parallel with the extending direction of a bit line. Further, FIGS. 9A and 9B show conceptual circuit diagrams of the nonvolatile memory according to the third aspect of the present invention. FIG. 10 shows a more specific circuit diagram of the conceptual circuit diagram of FIG. 9A, and FIG. 11 shows a more specific circuit diagram of the conceptual circuit diagram of FIG. 9B. While FIGS. 10 and 11 show two nonvolatile memories $M_1$ and $M_2$, these nonvolatile memories $M_1$ and $M_2$ are structurally the same, and the nonvolatile memory $M_1$ will be explained below.

The nonvolatile memory $M_1$ of Example 2 comprises;

(A) a bit line $BL_1$, (B) transistors for selection $TR_{1N}$, that are N in number ($N \geq 2$, and N=2 in Example 2), (C) memory units $MU_{1N}$ that are N in number, each memory unit being composed of memory cells $MC_{1NM}$ that are M in number ($M \geq 2$, and M=4 in Example 2), and (D) plate lines $PL_M$ that are M in number.

The memory units $MU_{1N}$ that are N in number are stacked through an insulating interlayer 26. Each memory cell comprises a first electrode, a ferroelectric layer and a second electrode. Specifically, each memory cell $MC_{11M}$ constituting the memory unit $MU_{11}$ of the first layer comprises a first electrode 21, a ferroelectric 22 and a second electrode 23, and each memory cell $MC_{12M}$ constituting the memory unit $MU_{12}$ of the second layer comprises a first electrode 31, a ferroelectric 32 and a second electrode 33. Further, in each memory unit $MU_{1n}$, the first electrodes 21 or 31 of the memory cells $MC_{1nm}$ are in common. Specifically, in the memory unit $MU_{11}$ of the first layer, the first electrodes 21 of the memory cells $MC_{11M}$ are in common. The common first electrode 21 will be sometimes referred to as "first common node $CN_{11}$". In the memory unit $MU_{12}$ of the second layer, the first electrodes 31 of the memory cells $MC_{12M}$ are in common. The common first electrode 31 will be sometimes referred to as "second common node $CN_{12}$". Further, in the memory unit $MU_{1n}$ of the n-th layer (n=1, 2 ... N), the second electrode 23 or 33 of the m-th-place (m=1, 2 ..., M) memory cell is connected to the m-th-place plate line $PL_m$ common to the memory units $MU_{1n}$. In Example 2, more specifically, each plate line is extending from the second electrode 23 or 33 and is connected in a region that is not shown.

The ferroelectric layer 22 or 32 constituting each memory cell $MC_{1nm}$ is composed of lead titanate zirconate [Pb(Zr$_X$, Ti$_Y$)O$_3$], and the lead titanate zirconate has a composition that satisfies $0.6 < Y/(X+Y) \leq 0.9$.

The common first electrode in the memory unit $MU_{1n}$ of the n-th layer (n=1, 2 ..., N) is connected to the bit line $BL_1$ through the n-th-place transistor for selection $TR_{1n}$. Specifically, one source/drain region 14A of each of the transistors for selection $TR_{11}$ and $TR_{12}$ is connected to the bit line $BL_1$, and the other source/drain region 14B of the first-place transistor for selection $TR_{11}$ is connected to the common first electrode 21 (first common node $CN_{11}$) in the memory unit $MU_{11}$ of the first layer through a contact hole 17 of a first layer formed in an insulating layer 16. The other source/drain region 14B of the second-place transistor for selection $TR_{12}$ is connected to the common first electrode 31 (second common node $CN_{12}$) in the memory unit $MU_{12}$ of the second layer through a contact hole 17 of the first layer formed in the insulating layer 16, a pad portion 25 and a contact hole 27 of a second layer formed in the insulating interlayer 26.

The bit line $BL_1$ is connected to a sense amplifier SA. The plate line $PL_M$ is connected to a plate line decoder/driver PD. Further, word lines $WL_1$ and $WL_2$ (or word lines $WL_{11}$, $WL_{12}$, $WL_{21}$ and $WL_{22}$) are connected to a word line decoder/driver WD. The word lines $WL_1$ and $WL_2$ are extending in the direction perpendicular to the paper surface of FIG. 8. The second electrode 23 of the memory cell $MC_{11m}$ constituting the nonvolatile memory $M_1$ is common to the second electrode of the memory cell $MC_{21m}$ constituting the nonvolatile memory $M_2$ that is adjacent in the direction perpendicular to the paper surface of FIG. 8, and works as the plate line $PL_m$. Further, the second electrode 33 of the memory cell $MC_{12m}$ constituting the nonvolatile memory $M_1$ is common to the second electrode of the memory cell $MC_{22m}$ constituting the nonvolatile memory $M_2$ that is adjacent in the direction perpendicular to the paper surface of FIG. 8, and works as the plate line $PL_m$. These plate lines $PL_m$ are connected to each other in a region that is not shown. Further, the word line $WL_1$ is common to the transistor for selection $TR_{11}$ constituting the nonvolatile memory $M_1$ and the transistor for selection $TR_{21}$ constituting the nonvolatile memory $M_2$ that is adjacent in the direction perpendicular to the paper surface of FIG. 8. Further, the word line $WL_2$ is common to the transistor for selection $TR_{12}$ constituting the nonvolatile memory $M_1$ and the transistor for selection $TR_{22}$ constituting the nonvolatile memory $M_2$ that is adjacent in the direction perpendicular to the paper surface of FIG. 8.

In the nonvolatile memories $M_1$ and $M_2$ whose circuit diagrams are shown in FIGS. 9A and 10, the transistors for selection $TR_{1n}$ and $TR_{2n}$ constituting the nonvolatile memories $M_1$ and $M_2$ are connected to the same word line $WL_n$. And, complementary data is stored in a pair of the memory cells $MC_{1nm}$ and $MC_{2nm}$ (n=1, 2, and m=1, 2 ..., M). For example, when data stored in the memory cells $MC_{11m}$ and $MC_{21m}$ (m is one of 1, 2, 3 and 4 in this case) is read out, the word line $WL_1$ is selected, a voltage, for example, of ($\frac{1}{3}$) $V_{cc}$ is applied to the plate lines $PL_j$ (m≠j), and in this case, the plate line $PL_m$ is driven. In this manner, the complementary data appears, as voltages (bit line potentials), on a pair of the bit lines $BL_1$ and $BL_2$ from a pair of the memory cells $MC_{11m}$ and $MC_{21m}$ through the transistors for selection $TR_{11}$ and $TR_{21}$. And, the voltages (bit line potentials) on the pair of the bit lines $BL_1$ and $BL_2$ are detected with the sense amplifier SA. Alternatively, the transistors for selection $TR_{11}$, $TR_{12}$, $TR_{21}$ and $TR_{22}$ constituting the nonvolatile memories $M_1$ and $M_2$ are connected to different word lines $WL_{11}$, $WL_{12}$, $WL_{21}$ and $WL_{22}$, respectively, the memory cells $MC_{1nm}$ and $MC_{2nm}$ are independently controlled, and a reference voltage is applied to one of a pair of the bit lines $BL_1$ and $BL_2$, whereby data can be also read out from each of the memory cells $MC_{1nm}$ and $MC_{2nm}$. For circuit diagrams when the above constitution is employed, see FIGS. 9B and 11. When the transistors for selection $TR_{11}$ and $TR_{21}$ are simultaneously driven, and when the transistors for selection $TR_{12}$ and $TR_{22}$ are simultaneously driven, circuits for such are equivalent to the circuits shown in FIGS. 9A and 10. As described above, 1 bit as data is stored in each of the memory cells $MC_{1nm}$ and $MC_{2nm}$ (n=1, 2 and m=1, 2, 3, 4) (see FIGS. 9B and 11), or the complementary data as 1 bit is stored in a pair of the memory cells $MC_{1nm}$ and $MC_{2nm}$ (see FIGS. 9A and 10). In an actual nonvolatile memory, sets of the above memory units for storing 16 bits or 8 bits each are arranged as access units in the form of an array. The value of M is not limited to 4. The value of M may be any number so long as it satisfies $M \geq 2$, and examples of the value of M practically include exponent numbers of 2 (2, 4, 8, 16 ... ). Further, the value of N may be any number so long as it satisfies $N \geq 2$, and examples of the value of N practically include exponent numbers of 2 (2, 4, 8, ... ).

EXAMPLE 3

Figure 12:
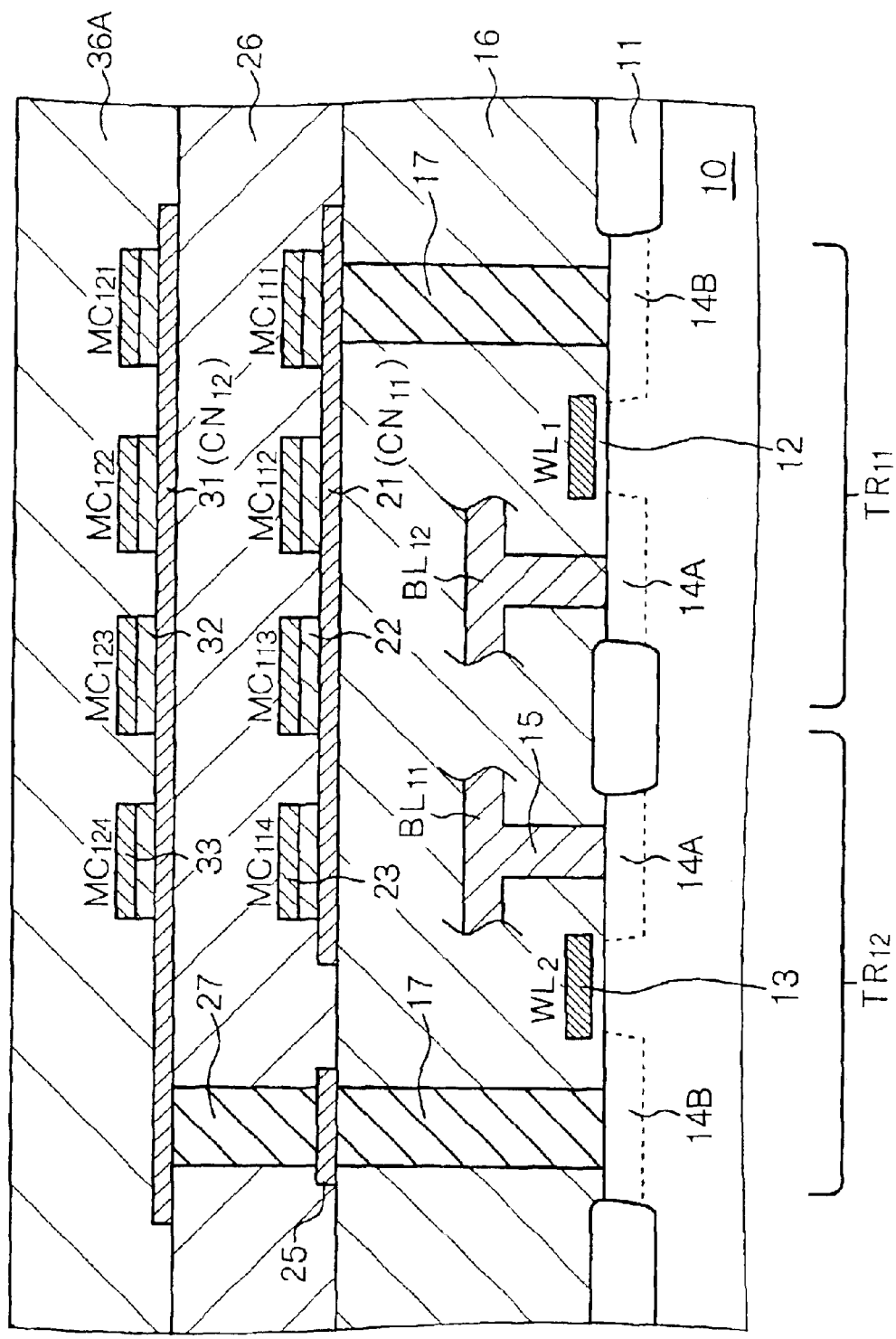
FIG. 12 is a schematic partial cross-sectional view of a semiconductor device including a ferroelectric-type nonvolatile semiconductor memory in Example 3, taken by cutting it with an imaginary plane in parallel with the extending direction of a bit line.
Figure 13A:
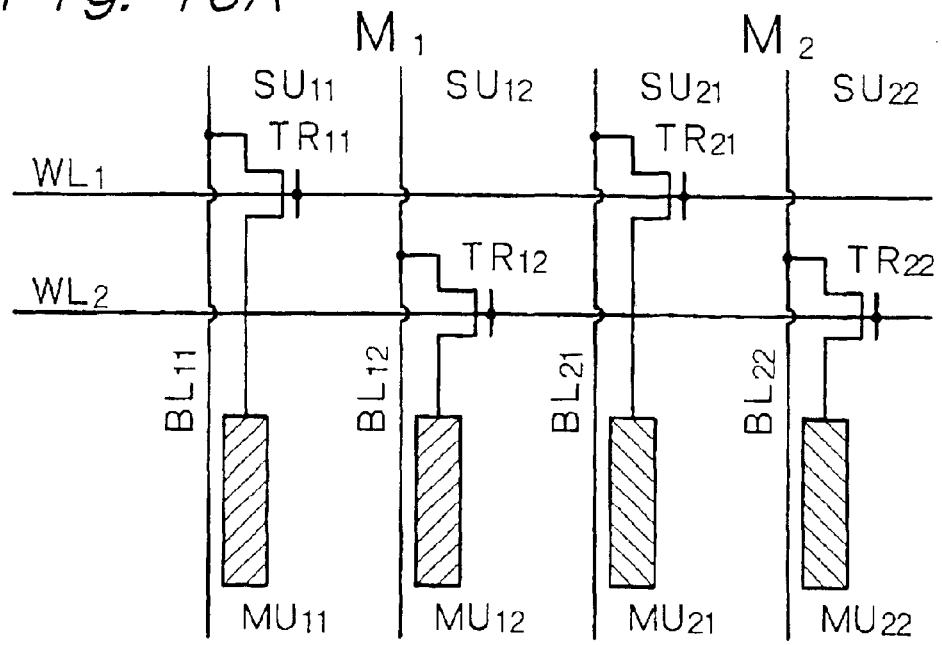
FIGS. 13A and 13B are conceptual circuit diagrams of nonvolatile memories according to the fourth aspect of the present invention.
Figure 13B:
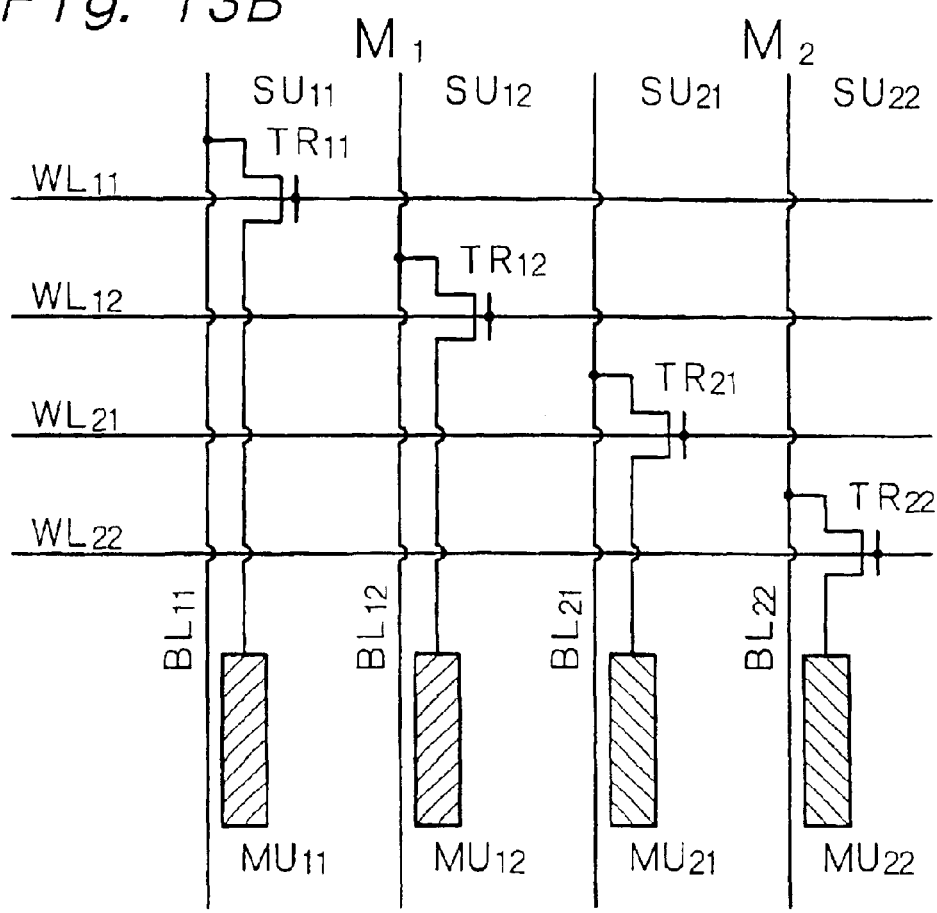
Figure 14:
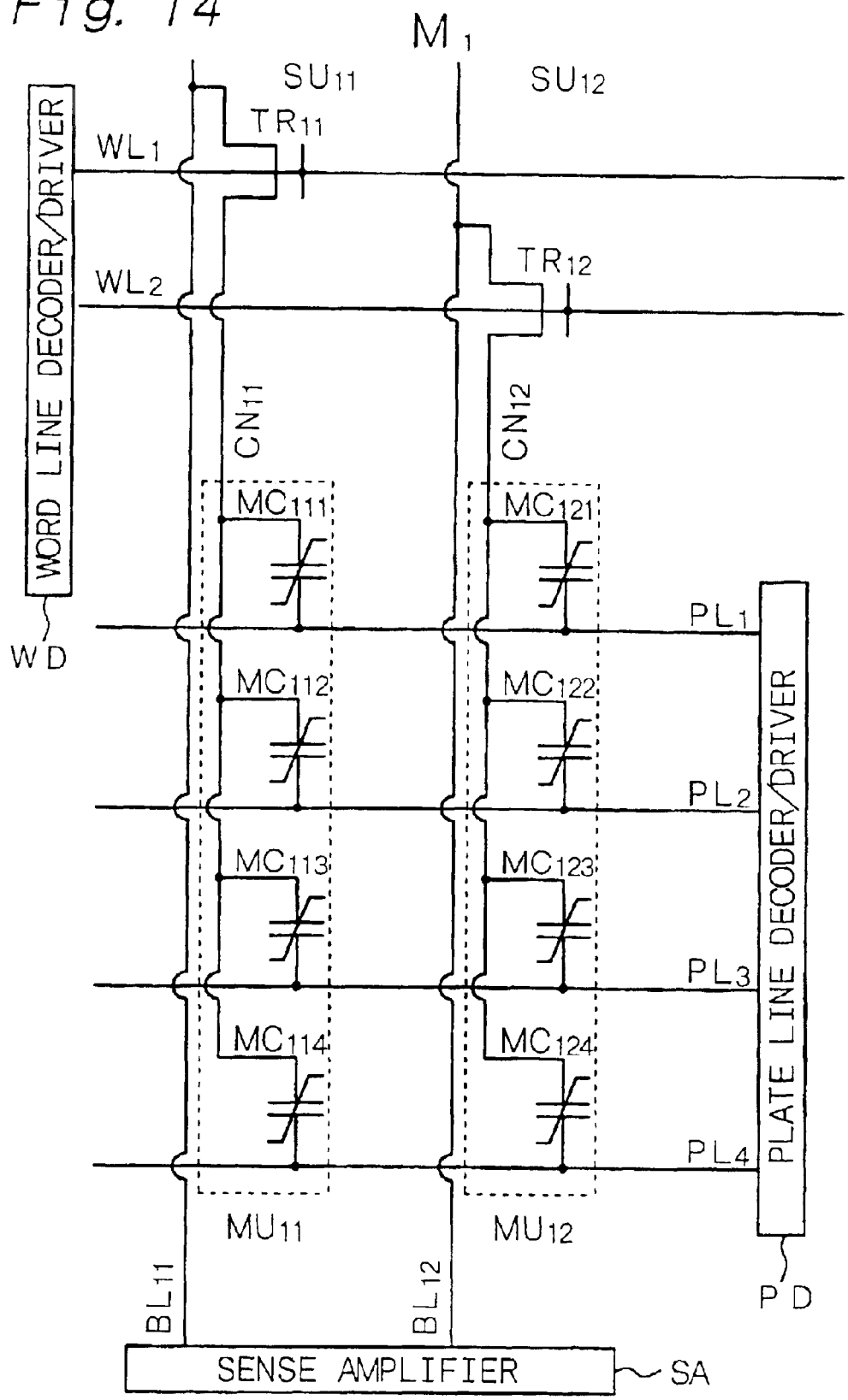
FIG. 14 is a more specific circuit diagram of the conceptual circuit diagrams shown in FIGS. 13A and 13B.

Example 3 is concerned with the nonvolatile memory according to the first and fourth aspects of the present invention. FIG. 12 shows a schematic partial cross-sectional view of the nonvolatile memory in Example 3, taken by cutting it with an imaginary plane in parallel with the extending direction of a bit line. Further, FIGS. 13A and 13B show conceptual circuit diagrams of the nonvolatile memory according to the fourth aspect of the present invention. FIG. 14 shows a more specific circuit diagram of the conceptual circuit diagram thereof. While FIGS. 13A and 13B show two nonvolatile memories $M_1$ and $M_2$, these nonvolatile memories $M_1$ and $M_2$ are structurally the same, and the nonvolatile memory $M_1$ will be explained below.

The nonvolatile memory $M_1$ of Example 3 comprises;

(A) bit lines $BL_{1N}$ that are N in number ($N \geq 2$, and $N=2$ in Example 3), (B) transistors for selection $TR_{1N}$, that are N in number, (C) memory units $MU_{1N}$ that are N in number, each memory unit being composed of memory cells $MC_{1NM}$ that are M in number ($M \geq 2$, and $M=4$ in Example 3), and (D) plate lines $PL_M$ that are M in number.

In FIGS. 13 and 14, the memory unit $MU_{11}$ composed of the bit line $BL_{11}$, the transistor for selection $TR_{11}$, and the memory cells $MC_{11}M$ is shown as a subunit $SU_{11}$, and the memory unit $MU_{12}$ composed of the bit line $BL_{12}$, the transistor for selection $TR_{12}$ and the memory cells $MC_{12}M$ is shown as a subunit $SU_{12}$.

The memory units $MU_{1N}$ that are N in number are stacked through an insulating interlayer 26. Each memory cell comprises a first electrode, a ferroelectric layer and a second electrode. Specifically, each of the memory cells $MC_{11M}$ constituting the memory unit $MU_{11}$ of the first layer comprises a first electrode 21, a ferroelectric 22 and a second electrode 23, and each of the memory cells $MC_{12}M$ constituting the memory unit $MU_{12}$ of the second layer comprises a first electrode 31, a ferroelectric 32 and a second electrode 33. In each memory unit $MU_{1n}$, the first electrodes 21 or 31 of the memory cells $MC_{1nm}$ are in common. Specifically, in the memory unit $MU_{11}$ of the first layer, the first electrodes 21 of the memory cells $MC_{11M}$ are in common. The common first electrode 21 will be sometimes referred to as first common node $CN_{11}$. In the memory unit $MU_{12}$ of the second layer, the first electrodes 31 of the memory cells $MC_{12M}$ are in common. The common first electrode 31 will be sometimes referred to as second common node $CN_{12}$. Further, in memory units $MU_{1n}$ of the n-th layer (n=1, 2 . . . , N), the second electrode 23 or 33 of the m-th-place (m=1, 2 . . . M) memory cell is connected to the m-th-place plate line $PL_m$ common to the memory units $MU_{1n}$. More specifically, in Example 3, each plate line is extending from the second electrode 23 or 33 and is connected in a region that is not shown.

The ferroelectric layer 22 or 32 constituting each memory cell $MC_{1nm}$ is composed of lead titanate zirconate [$Pb(Zr_X, Ti_Y)O_3$], and the lead titanate zirconate has a composition that satisfies $0.6 < Y/(X+Y) \geq 0.9$.

The common first electrode in the memory units $MU_{1n}$ of the n-th layer (n=1, 2 . . . , N) is connected to the n-th-place bit line $BL_{1n}$ through the n-th-place transistor for selection $TR_{1n}$. Specifically, one source/drain region 14A of the first-place transistor for selection $TR_{11}$ is connected to the first-place bit line $BL_{11}$, and the other source/drain region 14B of the first-place transistor for selection $TR_{11}$ is connected to the common first electrode 21 (first common node $CN_{11}$) in the memory unit $MU_{11}$ of the first layer through a contact hole 17 of a first layer formed in an insulating layer 16. Further, the other source/drain region 14B of the second-place transistor for selection $TR_{12}$ is connected to the common first electrode 31 (second common node $CN_{12}$) in the memory unit $MU_{12}$ of the second layer through a contact hole 17 of the first layer formed in the insulating layer 16, a pad portion 25 and a contact hole 27 formed in the insulating interlayer 26.

The bit line $BL_{1n}$ is connected to a sense amplifier SA. The plate line $PL_M$ is connected to a plate line decoder/driver PD. Further, the word lines $WL_1$ and $WL_2$ (or word lines $WL_{11}$, $WL_{12}$, $WL_{21}$ and $WL_{22}$) are connected to a word line decoder/driver WD. Further, the word lines $WL_1$ and $WL_2$ are extending in the direction perpendicular to the paper surface of FIG. 12. The second electrode 23 of the memory cell $MC_{11m}$ constituting the nonvolatile memory $M_1$ is common to the second electrode of the memory cell $MC_{21m}$ constituting the nonvolatile memory $M_2$ that is adjacent in the direction perpendicular to the paper surface of FIG. 12, and works as the plate line $PL_m$. Further, the second electrode 33 of the memory cell $MC_{12m}$ constituting the nonvolatile memory $M_1$ is common to the second electrode of the memory cell $MC_{22m}$ constituting the nonvolatile memory $M_2$ that is adjacent in the direction perpendicular to the paper surface of FIG. 12, and works as the plate line $PL_m$. These plate lines $PL_m$ are connected to each other in a region that is not shown. Further, the word line $WL_1$ is common to the transistor for selection $TR_{11}$ constituting the nonvolatile memory $M_1$ and the transistor for selection $TR_{21}$ constituting nonvolatile memory $M_2$ that is adjacent in the direction perpendicular to the paper surface of FIG. 12. Further, the word line $WL_2$ is common to the transistor for selection $TR_{12}$ constituting the nonvolatile memory $M_1$ and the transistor for selection $TR_{22}$ constituting the nonvolatile memory $M_2$ that is adjacent in the direction perpendicular to the paper surface of FIG. 12.

In the nonvolatile memories $M_1$ and $M_2$ whose circuit diagrams are shown in FIGS. 13A and 14, the transistors for selection $TR_{11}$ and $TR_{21}$ constituting the nonvolatile memories $M_1$ and $M_2$ are connected to the same word line $WL_1$, and the transistors for selection $TR_{12}$ and $TR_{22}$ are connected to the same word line $WL_2$. And, the complementary data is stored in a pair of the memory cells $MC_{1nm}$ and $MC_{2nm}$ (n=1, 2 and m=1, 2 . . . , M). For example, when data stored in the memory cells $MC_{11m}$ and $MC_{21m}$ (m is one of 1, 2, 3 and 4) is read out, the word line $WL_1$ is selected, a voltage, for example, of $(\frac{1}{3})V_{cc}$ is applied to the plate lines $PL_j$ (m≠j), and in this state, the plate line $PL_m$ is driven. In the above manner, the complementary data appears, as voltages (bit line potentials), on a pair of the bit lines $BL_{11}$ and $BL_{21}$ from a pair of the memory cell $MC_{11m}$ and $MC_{21m}$ through the transistors for selection $TR_{11}$ and $TR_{21}$. And, the voltages (bit line potentials) on the pair of the bit lines $BL_{11}$ and $BL_{21}$ are detected with the sense amplifier SA. Alternatively, the transistors for selection $TR_{11}$, $TR_{12}$, $TR_{21}$ and $TR_{22}$ constituting the nonvolatile memories $M_1$ and $M_2$ are connected to different word lines $WL_{11}$, $WL_{12}$, $WL_{21}$ and $WL_{22}$, respectively, the memory cells $MC_{1nm}$ and $MC_{2nm}$ are independently controlled, and a reference voltage is applied to one of a pair of the bit lines $BL_{11}$ and $BL_{21}$ or one of a pair of the bit lines $BL_{12}$ and $BL_{22}$, whereby data can be read out from each of the memory cell $MC_{1nm}$ and $MC_{2nm}$. For circuit diagrams when the above constitution is employed, see FIGS. 13B and 14. When the transistors for selection $TR_{11}$ and $TR_{21}$ are simultaneously driven, and when the transistors for selection $TR_{12}$ and $TR_{22}$ are simultaneously driven, a circuit for such is equivalent to the circuit shown in FIG. 13A. In the above manner, 1 bit as data is stored in each of the memory cells $MC_{1nm}$ and $MC_{2nm}$ (n=1, 2 and m=1, 2, 3, 4) (see FIG. 13B), or the complementary data as 1 bit is stored in a pair of the memory cells $MC_{1nm}$ and $MC_{2nm}$ (see FIG. 13A). In an actual nonvolatile memory, sets of the above memory units for storing 16 bits or 8 bits each are arranged as access units in the form of an array. The value of M is not limited to 4. The value of M may be any number so long as it satisfies $M \geq 2$, and examples of the value of M practically include exponent numbers of 2 (2, 4, 8, 16 . . . ). Further, the value of N may be any number so long as it satisfies $N \geq 2$, and examples of the value of N practically include exponent numbers of 2 (2, 4, 8, . . . ).

Alternatively, in the nonvolatile memory $M_1$ whose circuit diagram is shown in FIGS. 13A and 14, the complementary data may be stored in a pair of the memory cells $MC_{11m}$ and $MC_{12m}$ (m=1, 2 . . . , M). For example, when data stored in the memory cells $MC_{11m}$ and $MC_{12m}$ (m is one of 1, 2, 3 and 4) is read out, the word lines $WL_1$ and $WL_2$ are selected, a voltage, for example, of (1/3) $V_{cc}$ is applied to the plate lines $PL_j$ (m≠j), and in this state, the plate line $PL_m$ is driven. In the above manner, the complementary data appears, as voltages (bit line potentials), on a pair of the bit lines $BL_{11}$ and $BL_{12}$ from a pair of the memory cell $MC_{11m}$ and $MC_{12m}$ through the transistors for selection $TR_{11}$ and $TR_{12}$. And, the voltages (bit line potentials) on the pair of the bit lines $BL_{11}$ and $BL_{12}$ are detected with the sense amplifier SA. Alternatively, the memory cells $MC_{11m}$ and $MC_{12m}$ are independently controlled, and a reference voltage is applied to one of a pair of the bit lines $BL_{11}$ and $BL_{12}$, whereby data can be read out from each of the memory cell $MC_{11m}$ and $MC_{12m}$. For circuit diagrams when the above constitution is employed, see FIGS. 13B and 14.

The present invention is explained with reference to Examples hereinabove, while the present invention shall not be limited thereto. The structures of the nonvolatile memories, materials, various forming conditions, circuit constitutions, operation methods, etc., explained in Examples are given for an illustrative purpose and may be modified as required.

When the total number of signal lines for driving units is A, when the number of word lines of them is B, and when the number of plate lines of them is C, generally, A=B+C. When the total number A is constant, it is sufficient to satisfy B=C for maximizing the total address number (B×C) of the units. For attaining a most effective layout of peripheral circuits, it is sufficient to bring the word line number B and the plate line number C into agreement in the unit. Further, the number of word lines in row-address access units is equal, for example, to the number (N) of stacks of memory cells, and the number of plate lines is also equal to the number (M) of memory cells constituting the memory units. With an increase in the number of word lines and the number of plate lines, the substantial integration degree of the nonvolatile memory is more improved. And, a product of the number of word lines and the number of plate lines represents the number of addresses that are accessible. When making an access in the block (altogether) and continuously is a premise, a value obtained by deducting 1 from the above product is the number of disturbance. Therefore, the value of product of the number of word lines and the number of plate lines is determined on the basis of durability against disturbance and process factors.

Figure 15:
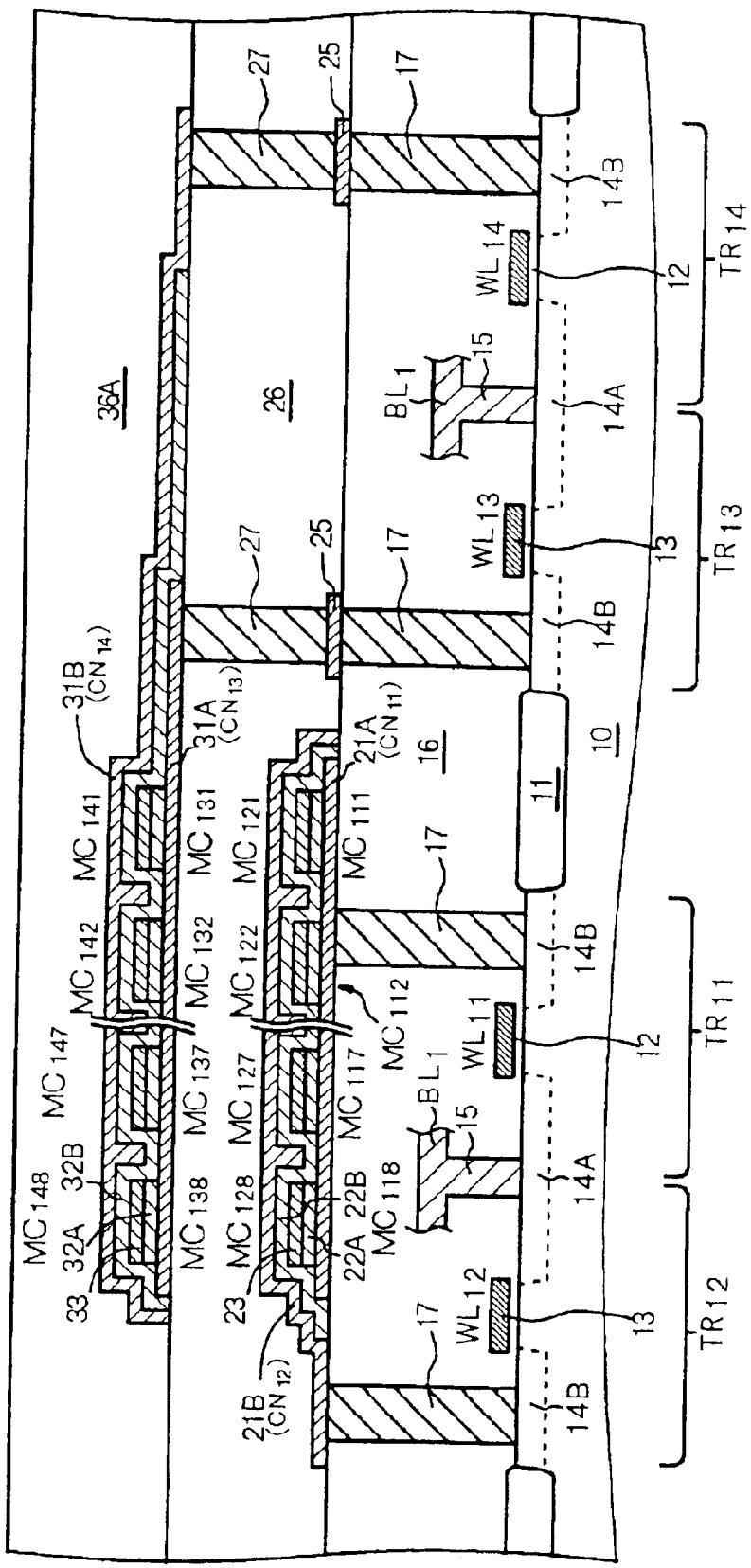
FIG. 15 is a schematic partial cross-sectional view of a variant of the ferroelectric-type nonvolatile semiconductor memory explained in Example 2.
Figure 16:
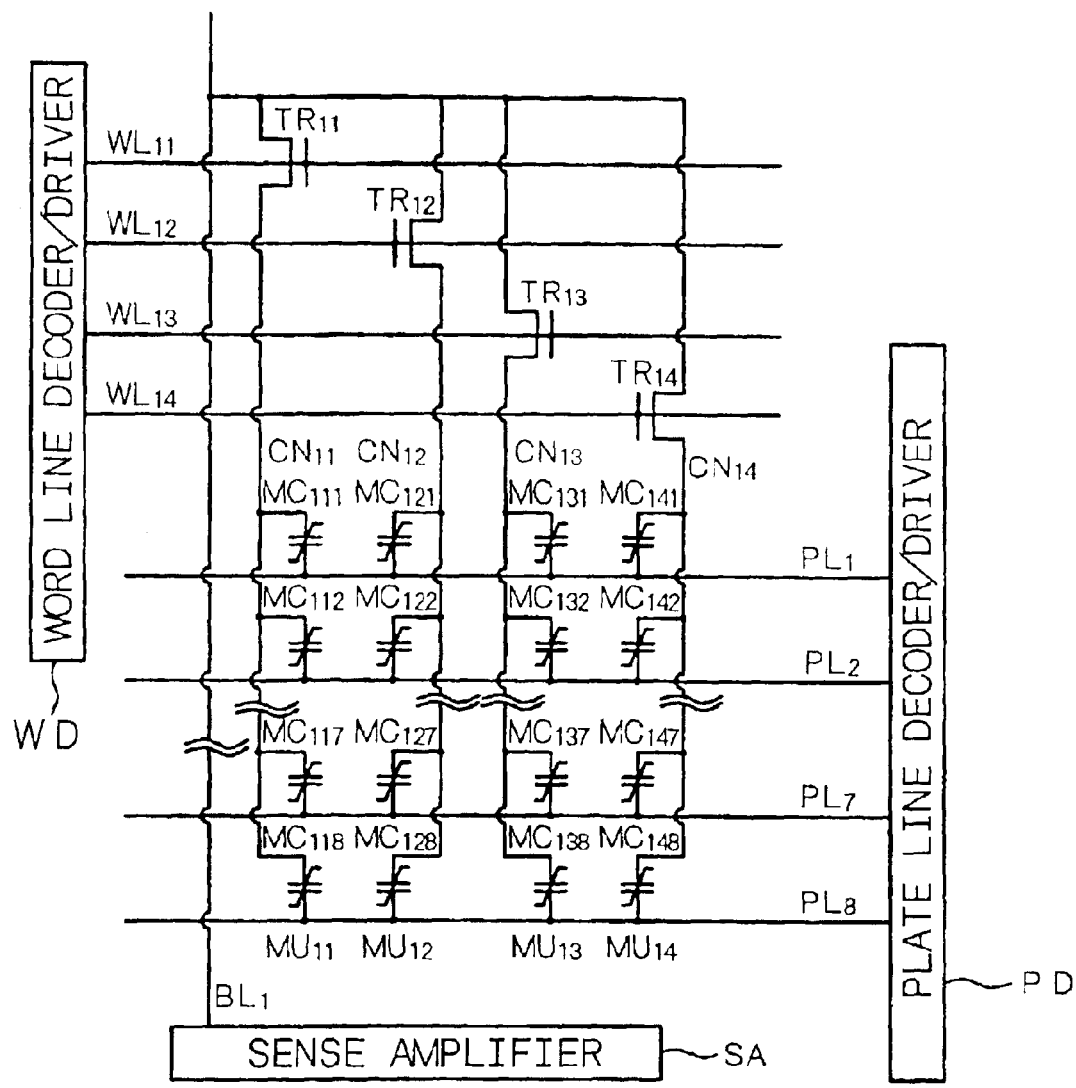
FIG. 16 is a circuit diagram of the ferroelectric-type nonvolatile semiconductor memory shown in FIG. 15.

The nonvolatile memory explained in Example 2 can be modified to have a structure as shown in FIG. 15. FIG. 16 shows a circuit diagram thereof.

The above nonvolatile memory comprises a bit line $BL_1$ connected to a sense amplifier SA, transistors for selection $TR_{11}, TR_{12}, TR_{13}$ and $TR_{14}$ that are N in number ($N \geq 2$, and N=4 in this embodiment) and is formed of a MOS type FET each, memory units $MU_{11}, MU_{12}, MU_{13}$ and $MU_{14}$ that are N in number, and plate lines. The memory unit $MU_{11}$ of a first layer is composed of memory cells $MC_{11m}$ (m=1, 2 . . . , 8) that are M in number ($M \geq 2$, and M=8 in this embodiment). The memory unit $MU_{12}$ of a second layer is also composed of memory cells $MC_{12m}$ (m=1, 2 . . . , 8) that are M in number (M=8). The memory unit $MU_{13}$ of a third layer is also composed of memory cells $MC_{13m}$ (m=1, 2 . . . , 8) that are M in number (M=8), and the memory unit $MU_{14}$ of a fourth layer is also composed of memory cells $MC_{14m}$ (m=1, 2 . . . , 8) that are M in number (M=8). The number of the plate lines is M (M=8 in this embodiment), and shown by $PL_m$ (m=1, 2 . . . , 8). A word line $WL_{1n}$ connected to a gate electrode of the transistor for selection $TR_{1n}$ is connected to a word line decoder/driver WD. Each plate line $PL_m$ is connected to a plate line decoder/driver PD.

Further, each memory cell $MC_{11m}$ constituting the memory unit $MU_{11}$ of the first layer comprises a first electrode 21A, a ferroelectric layer 22A and a second electrode 23, each memory cell $MC_{12m}$ constituting the memory unit $MU_{12}$ of the second layer comprises a first electrode 21B, a ferroelectric layer 22B and the second electrode 23, each memory cell $MC_{13m}$ constituting the memory unit $MU_{13}$ of the third layer comprises a first electrode 31A, a ferroelectric layer 32A and a second electrode 33, and each memory cell $MC_{14m}$ constituting the memory unit $MU_{14}$ of the fourth layer comprises a first electrode 31B, a ferroelectric layer 32B and the second electrode 33. In each of the memory units $MU_{11}, MU_{12}, MU_{13}$ and $MU_{14}$, the first electrodes 21A, 21B, 31A or 31B of the memory cells are in common. The common first electrodes 21A, 21B, 31A and 31B will be referred to as common nodes $CN_{11}, CN_{12}, CN_{13}$ and $CN_{14}$ for convenience.

The common first electrode 21A (first common node $CN_{11}$) in the memory unit $MU_{11}$ of the first layer is connected to the bit line $BL_1$ through the fist-place transistor for selection $TR_{11}$. The common first electrode 21B (second common node $CN_{12}$) in the memory unit $MU_{12}$ of the second layer is connected to the bit line $BL_1$ through the second-place transistor for selection TR12. The common first electrode 31A (third common node $CN_{13}$) in the memory unit $MU_{13}$ of the third layer is connected to the bit line $BL_1$ through the third-place transistor for selection $TR_{13}$. The common first electrode 31B (fourth common node $CN_{14}$) in the memory unit $MU_{14}$ of the fourth layer is connected to the bit line $BL_1$ through the fourth-place transistor for selection $TR_{14}$.

The memory cell $MC_{11m}$ constituting the memory unit $MU_{11}$ of the first layer and the memory cells $MC_{12}$, constituting the memory unit $MU_{12}$ of the second layer share the second electrode 23, and the shared m-th-place second electrode 23 is connected to the plate line $PL_m$. Further, the memory cell $MC_{13m}$ constituting the memory unit $MU_{13}$ of the third layer and the memory cells $MC_{14m}$ constituting the memory unit $MU_{14}$ of the fourth layer share the second electrode 33, and the shared m-th-place second electrode 33 is connected to the plate line $PL_m$. Specifically, the plate line $PL_m$ is constituted of an extending portion of the shared m-th-place second electrode 23, and the plate line $PL_m$ is constituted of an extending portion of the shared m-th-place second electrode 33, and the plate lines $PL_m$ are connected to each other in a region that is not shown.

In the above nonvolatile memory, the memory units $MU_{11}$ and $MU_{12}$, and the memory units $MU_{13}$ and $MU_{14}$, are stacked through an insulating interlayer 26. The memory unit $MU_{14}$ is covered with an insulation layer 36A. Further, the memory unit $MU_{11}$ is formed over a semiconductor substrate 10 through an insulating layer 16. A device-isolation region 11 is formed in the semiconductor substrate 10. Each of the transistors for selection $TR_{11}$, $TR_{12}$, $TR_{13}$ and $TR_{14}$ comprises a gate insulating film 12, a gate electrode 13 and source/drain regions 14A and 14B. One source/drain region 14A of each of the first-place transistor for selection $TR_{11}$, second-place transistor for selection $TR_{12}$, third-place transistor for selection $TR_{13}$ and fourth-place transistor for selection $TR_{14}$ is connected to the bit line $BL_1$ through a contact hole 15. The other source/drain region 14B of the first-place transistor for selection $TR_{11}$ is connected to the first common node $CN_{11}$ through a contact hole 17 formed in an opening portion formed through the insulating layer 16. Further, the other source/drain region 14B of the second-place transistor for selection $TR_{12}$ is connected to the second common node $CN_{12}$ through a contact hole 17. The other source/drain region 14B of the third-place transistor for selection $TR_{13}$ is connected to the third common node $CN_{13}$ through a contact hole 17, a pad portion 25 and a contact hole 27 formed in an opening portion formed through the insulating interlayer 26. Further, the other source/drain region 14B of the fourth-place transistor for selection $TR_{14}$ is connected to the fourth common node $CN_{14}$ through a contact hole 17, a pad portion 25 and a contact hole 27.

Figure 17:
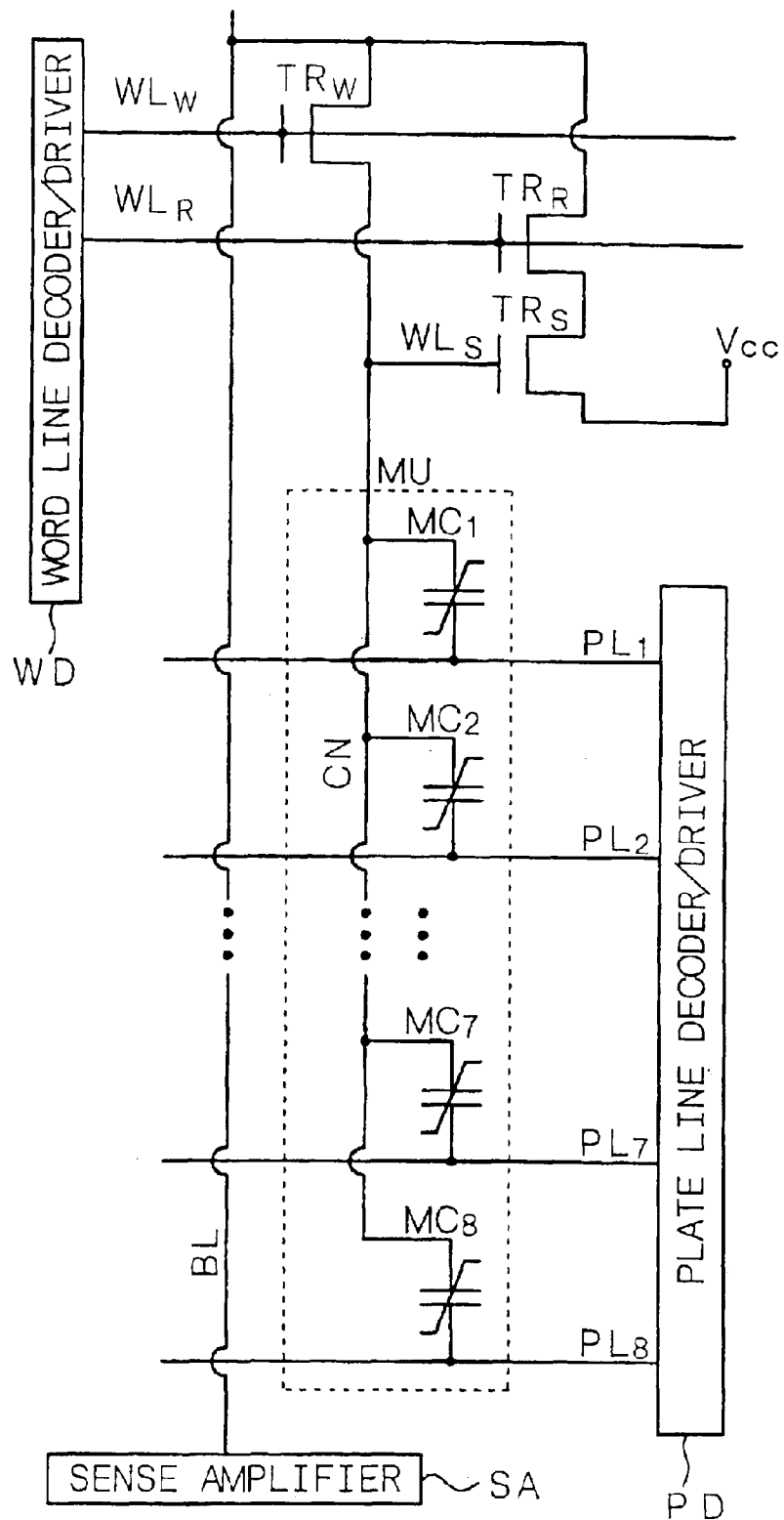
FIG. 17 is a circuit diagram of a gain-cell type ferroelectric-type nonvolatile semiconductor memory.
Figure 18:
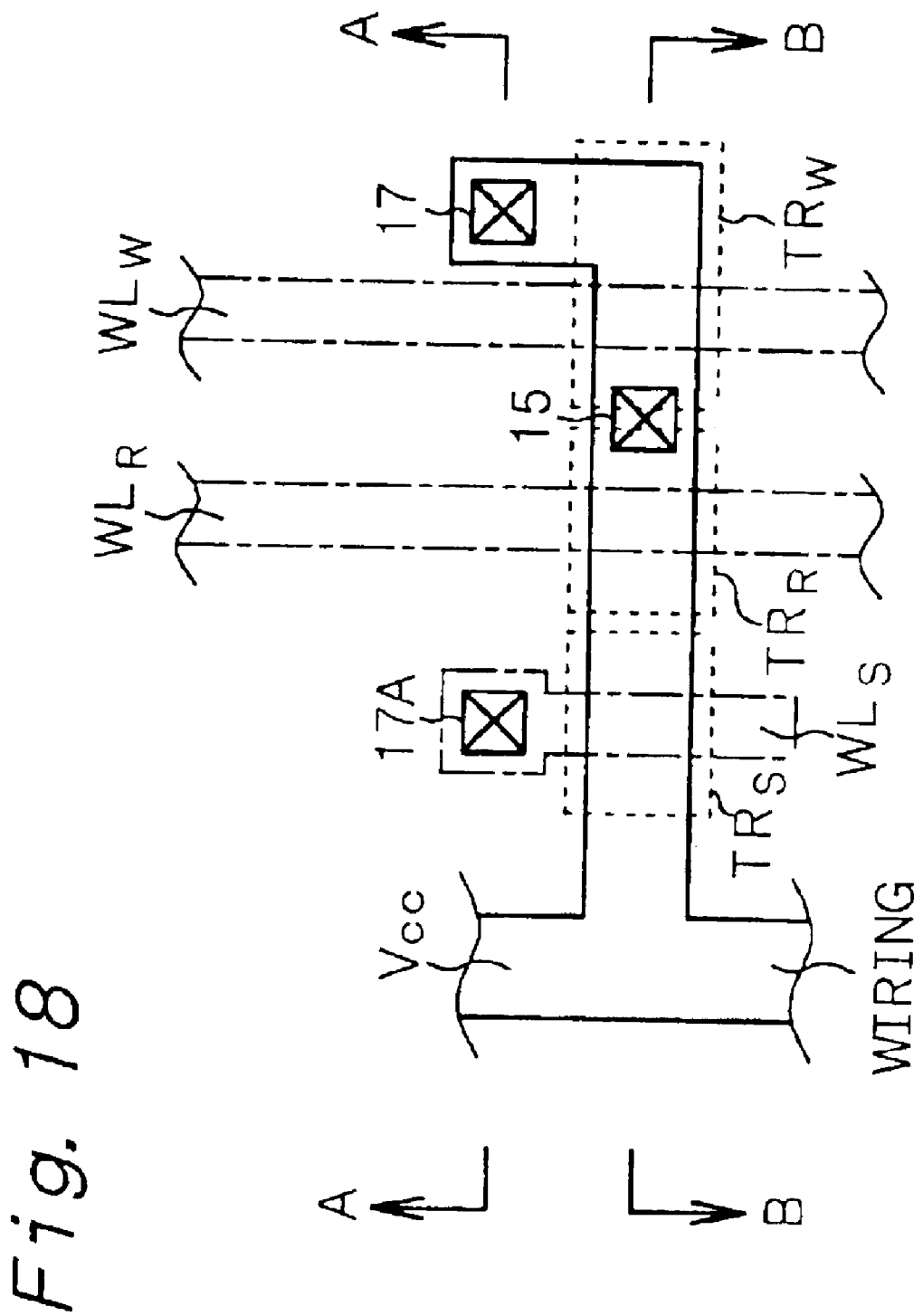
FIG. 18 is a layout drawing of the ferroelectric-type nonvolatile semiconductor memory shown in FIG. 17.
Figure 19:
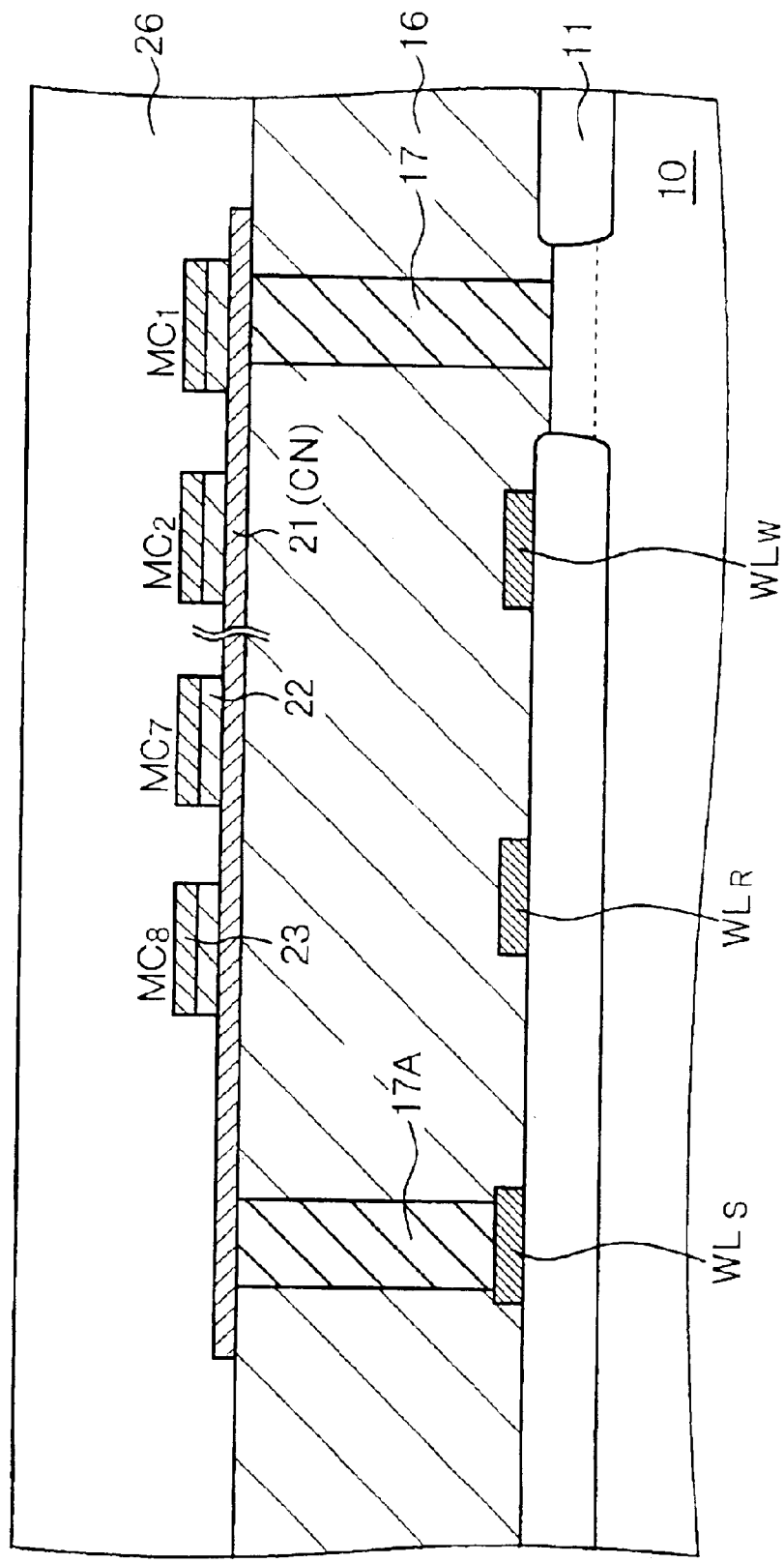
FIG. 19 is a schematic partial cross-sectional view of the ferroelectric-type nonvolatile semiconductor memory shown in FIG. 17.
Figure 20:
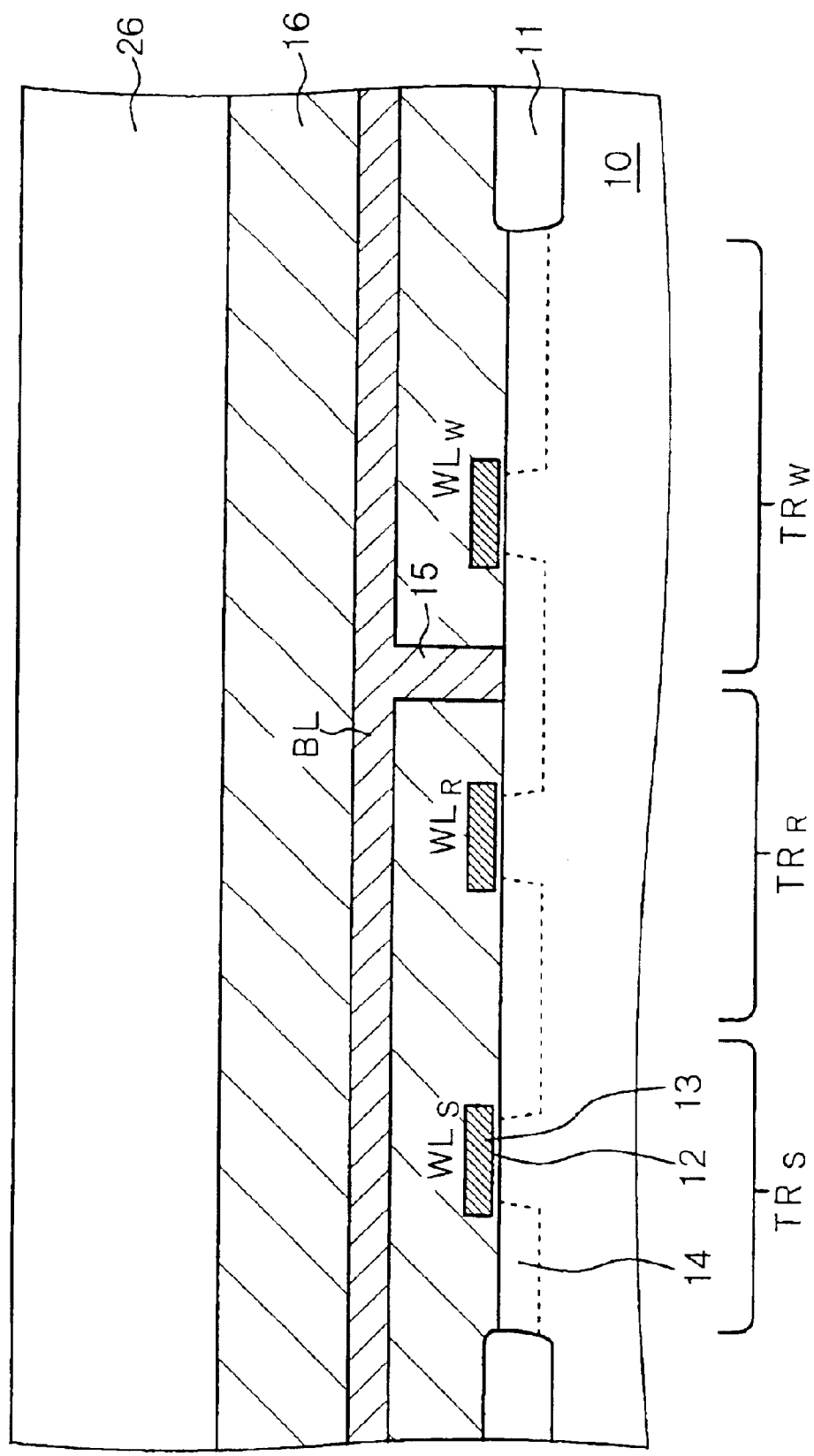
FIG. 20 is a schematic partial cross-sectional view of the ferroelectric-type nonvolatile semiconductor memory shown in FIG. 17, viewed from an angle different from that for FIG. 19.

The nonvolatile memory of the present invention can be a gain-cell type nonvolatile memory. FIG. 17 shows a circuit diagram of one example of such a nonvolatile memory, FIG. 18 shows a schematic layout of various transistors constituting the nonvolatile memory, and FIGS. 19 and 20 shows schematic partial cross-sectional views of the nonvolatile memory. In FIG. 18, various transistor regions are surrounded by dotted lines, active regions and a wiring are indicated by solid lines, and gate electrodes or word lines are indicated by chain lines. The schematic partial cross-sectional view of the nonvolatile memory shown in FIG. 19 is taken along line A—A in FIG. 18, and the schematic partial cross-sectional view of the nonvolatile memory shown in FIG. 20 is taken along line B—B in FIG. 18.

Application of a gain-cell type to the nonvolatile memory according to the second aspect of the present invention will be explained below. The nonvolatile memory comprises, for example, a bit line BL; a transistor for writing-in $TR_W$ (corresponding to a transistor for selection of nonvolatile memory according to any one of the first to fourth aspects of the present invention); memory units MU that are N in number (N≧2), each memory unit being composed of memory cells $MC_M$ that are M in number (M≧2, and for example, M=8), the memory units being stacked through an insulating interlayer; and plate lines $PL_M$ that are M in number. Each memory cell $MC_M$ comprises a first electrode 21, a ferroelectric layer 22 and a second electrode 23. The first electrodes 21 of the memory cells $MC_M$ constituting the memory unit MU are in common in the memory unit MU, the common first electrode (common node CN) is connected to the bit line BL through the transistor for writing-in $TR_W$, and the second electrode 23 constituting each memory cell $MC_m$ is connected to the plate line $PL_m$. The memory cells $MC_M$ are covered with an insulation layer 26. The number (M) of the memory cells constituting the memory unit MU of the nonvolatile memory is not limited to 8, and generally, it may be any number so long as it satisfies M≧2. The number (M) is preferably an exponent number of 2 (M=2, 4, 8, 16 . . . ).

Further, the nonvolatile memory has a signal detective circuit for detecting a change in the potential of the common first electrode and transmitting a detection result to the bit line as a current or a voltage. In other words, the nonvolatile memory has a transistor for detection $TR_S$ and a transistor for read-out $TR_R$. The signal detective circuit comprises the transistor for detection $TR_S$ and the transistor for read-out $TR_R$. One end of the transistor for detection $TR_S$ is connected to a wiring having a predetermined potential $V_{cc}$ (power source line formed of an impurity layer), and the other end is connected to the bit line BL through the transistor for read-out $TR_R$. When data stored in each memory cell $MC_m$ is read out, the transistor for read-out $TR_R$ is brought into a conducted state, and the operation of the transistor for detection $TR_S$ is controlled by a potential that occurs in the common first electrode (common node CN) on the basis of data stored in each memory cell $MC_m$.

Specifically, the various transistors are formed of MOS type FETs, one source/drain region of the transistor for writing-in (transistor for selection) $TR_W$ is connected to the bit line BL through a contact hole 15 formed in an insulating layer 16. The other source/drain region thereof is connected to the common first electrode (common node CN) through a contact hole 17 formed in an opening portion formed through the insulating layer 16. Further, one source/drain region of the transistor for detection $TR_S$ is connected to a wiring having a predetermined potential $V_{cc}$, and the other source/drain region thereof is connected to one source/drain region of the transistor for read-out $TR_R$. More specifically, the other source/drain region of the transistor for detection $TR_S$ and one source/drain region of the transistor for read-out $TR_R$ occupy one source/drain region. Further, the other source/drain region of the transistor for read-out $TR_R$ is connected to the bit line BL through a contact hole 15. Further, the common first electrode (common node CN or the other source/drain region of the transistor for writing-in $TR_W$) is connected to a gate electrode of the transistor for detection $TR_S$ through a contact hole 17A formed in an opening portion and a word line $WL_S$. Further, a word line $WL_W$ connected to a gate electrode of the transistor for writing-in $TR_W$ and a word line $WL_R$ connected to a gate electrode of the transistor for read-out $TR_R$ are connected to a word line decoder/driver WD. Each plate line $PL_m$ is connected to a plate line decoder/driver PD. Further, the bit line BL is connected to a sense amplifier SA.

When data is read out, for example, from a memory cell $MC_1$ of the above nonvolatile memory, $V_{cc}$ is applied to the selected plate line $PL_1$. If data "1" is stored in the above selected memory cell $MC_1$, polarization inversion takes place in the ferroelectric layer, an accumulated charge increases in amount, and the potential of the common node CN increases. If data "0" is stored in the selected memory cell $MC_1$, no polarization inversion takes place in the ferroelectric layer, and the potential of the common node CN hardly increases. That is, the common node CN is coupled with a plurality of non-selected plate lines $PL_j$ through the ferroelectric layers of non-selected memory cells, so that the potential of the common node CN is maintained at a level relatively close to 0 volt. In this manner, a change is caused in the common node CN depending upon data stored in the selected memory cell $MC_1$. Therefore, an electric field sufficient for polarization inversion can be applied to the ferroelectric layer of the selected memory cell. And, the bit line BL is brought to a floating state, and the transistor for read-out $TR_R$ is brought to an ON-state. Further, the operation of the transistor for detection $TR_S$ is controlled by the potential that occurs in the common first electrode (common node CN) on the basis of data stored in the selected memory cell $MC_1$. Specifically, when a high potential occurs in the common first electrode (common node CN) on the basis of data stored in the selected memory cell $MC_1$, the transistor for detection $TR_S$ comes to a continuity state. Since one source/drain region of the transistor for detection $TR_S$ is connected to the wiring having a predetermined potential $V_{cc}$, a current flows from the wiring to the bit line BL through the transistor for detection $TR_S$ and the transistor for read-out $TR_R$, and the potential of the bit line BL increases. That is, a change in the potential of the common first electrode (common node CN) is detected with the signal detective circuit, and the detection result is transmitted to the bit line BL as a voltage (potential). In this case, the potential of the bit line BL is approximately $(V_g-V_{th})$ in which $V_{th}$ is a threshold value of the transistor for detection $TR_S$ and $V_g$ is a potential of the gate electrode of the transistor for detection $TR_S$ (i.e., potential of the common node CN). When the transistor for detection $TR_S$ is a depression type NMOSFET, the threshold value $V_{th}$ has a negative value. In this manner, a stable sense signal amount can be secured regardless of the size of the load on the bit line BL. Further, the transistor for detection $TR_S$ can be constituted of PMOSFET.

Figure 21:
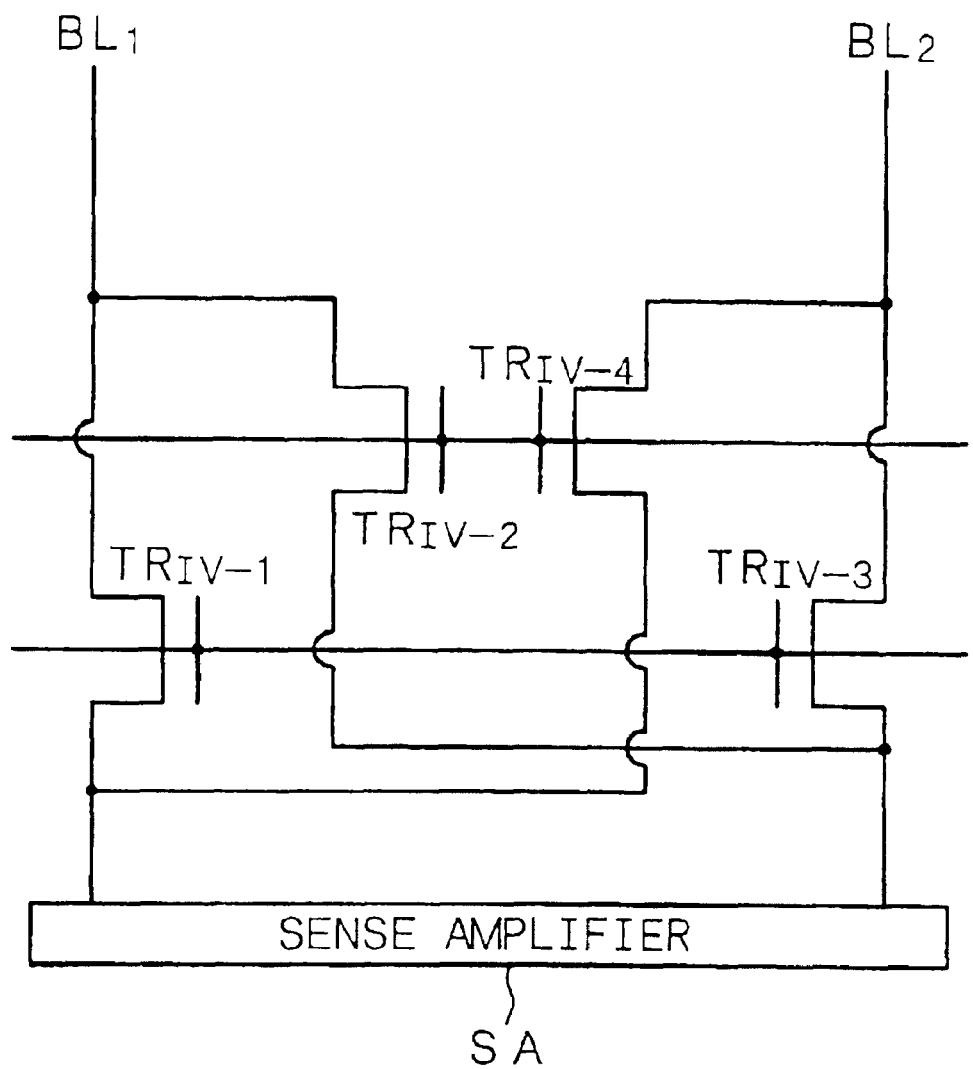
FIG. 21 is a circuit diagram showing a kind of switching circuit provided between bit lines when the predetermined potential of a wiring to which one end of the transistor for detection is connected is set at 0 volt.

The predetermined potential of the wiring to which one end of the transistor for detection is connected is not limited to $V_{cc}$, and the wiring may be grounded. That is, the predetermined potential of the wiring to which one end of the transistor for detection is connected may be 0 volt. In this case, if a potential $(V_{cc})$ appears on the bit line when data stored in the selected memory cell is read out, it is required to adjust the potential of the bit line to 0 volt when data is re-written, and if 0 volt appears on the bit line when data stored in the selected memory cell is read out, it is required to adjust the potential of the bit line to $V_{cc}$ when data is re-written. For this purpose, there can be employed a constitution in which a kind of switching circuit (inversion circuit) composed of transistors $TR_{IV-1}$, $TR_{IV-2}$, $TR_{IV-3}$ and $TR_{IV-4}$ shown in FIG. 21 is provided between the bit lines, the transistors $TR_{IV-2}$ and $TR_{IV-4}$ are brought to an ON-state when data is read out, and the transistors $TR_{IV-1}$ and $TR_{IV-3}$ are brought to an ON-state when data is re-written.

Figure 22:
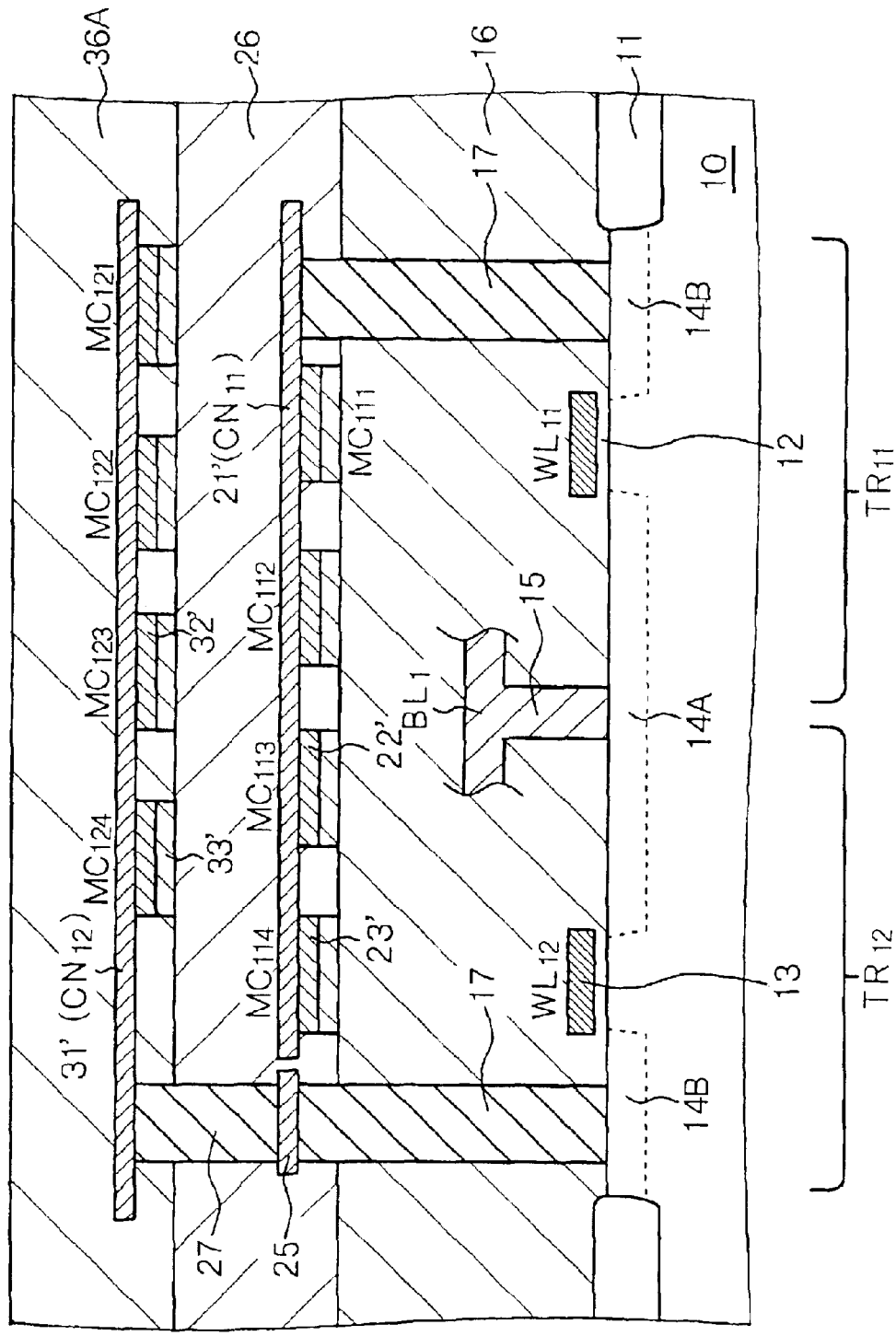
FIG. 22 is a schematic partial cross-sectional view of another variant of the ferroelectric-type nonvolatile semiconductor memory explained in Example 2.
Figure 23:
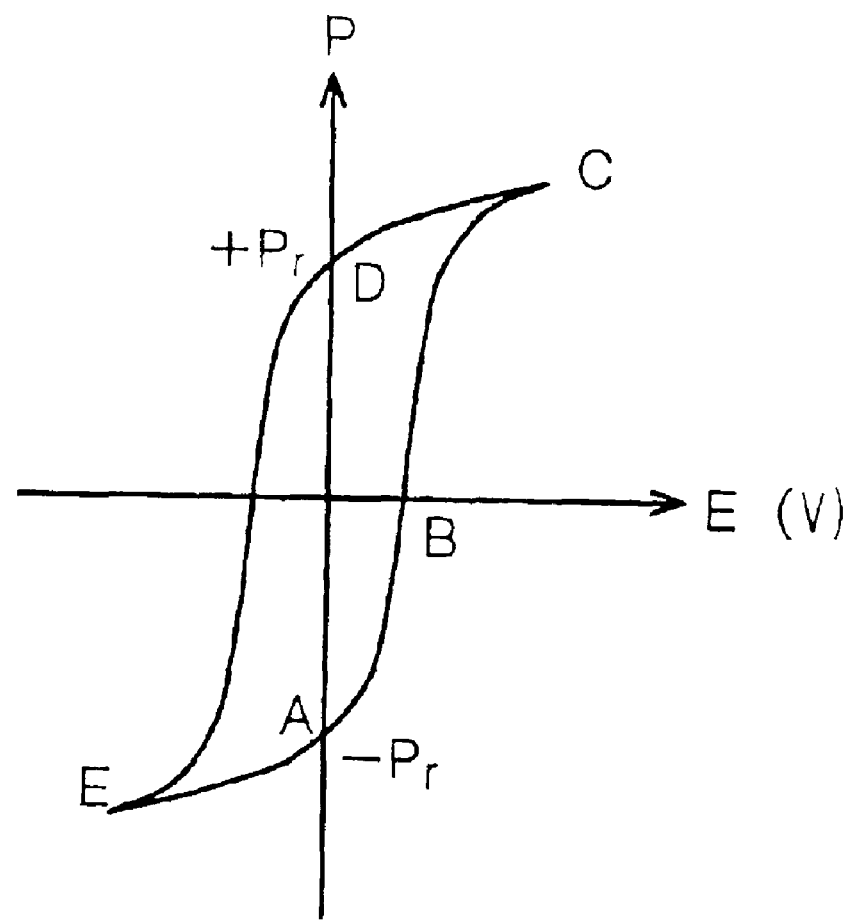
FIG. 23 shows a P-E(V) hysteresis loop of a ferroelectric material.
Figure 24:
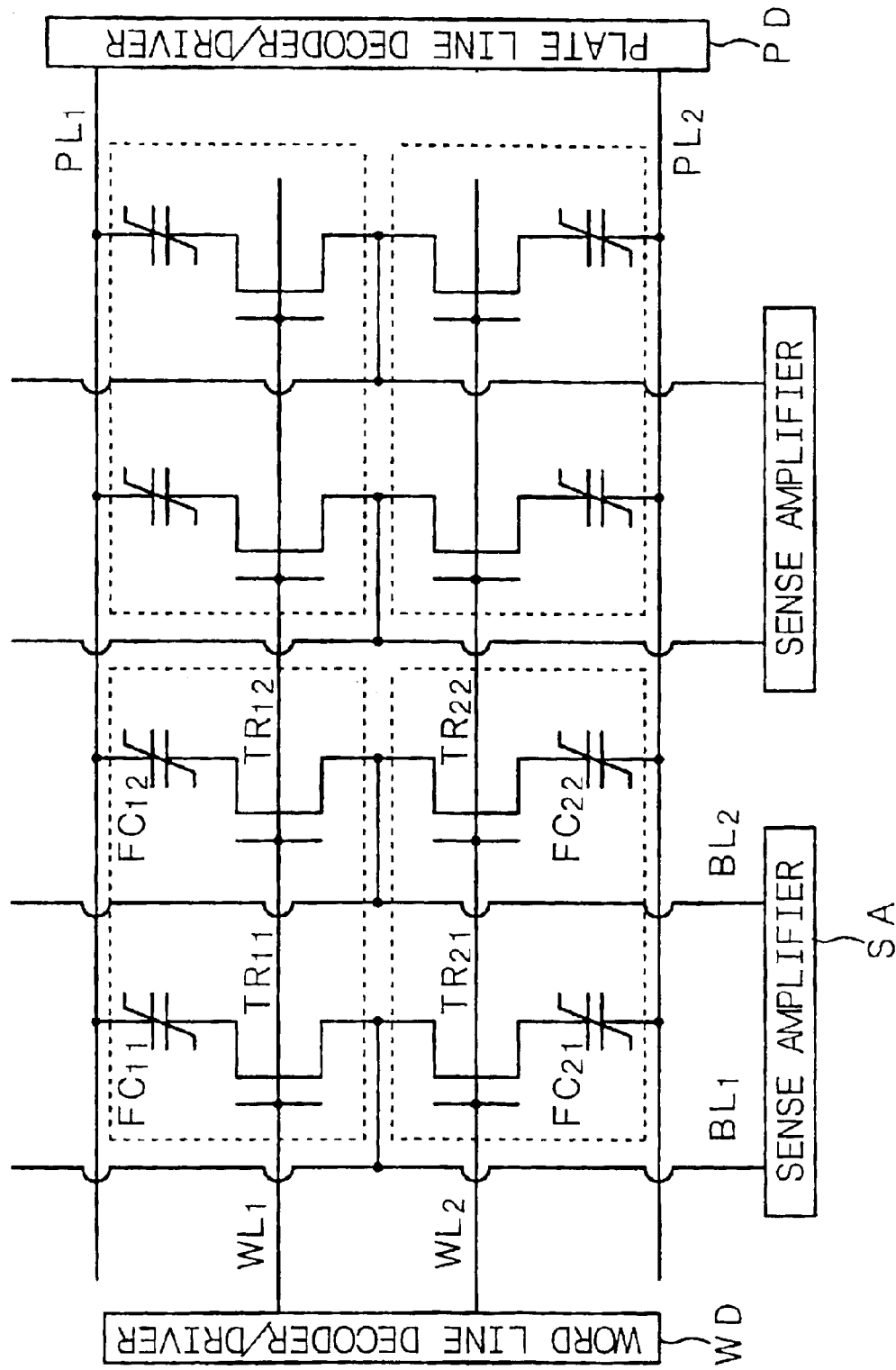
FIG. 24 is a circuit diagram of a ferroelectric-type nonvolatile semiconductor memory disclosed in U.S. Pat. No. 4,873,664.
Figure 25:
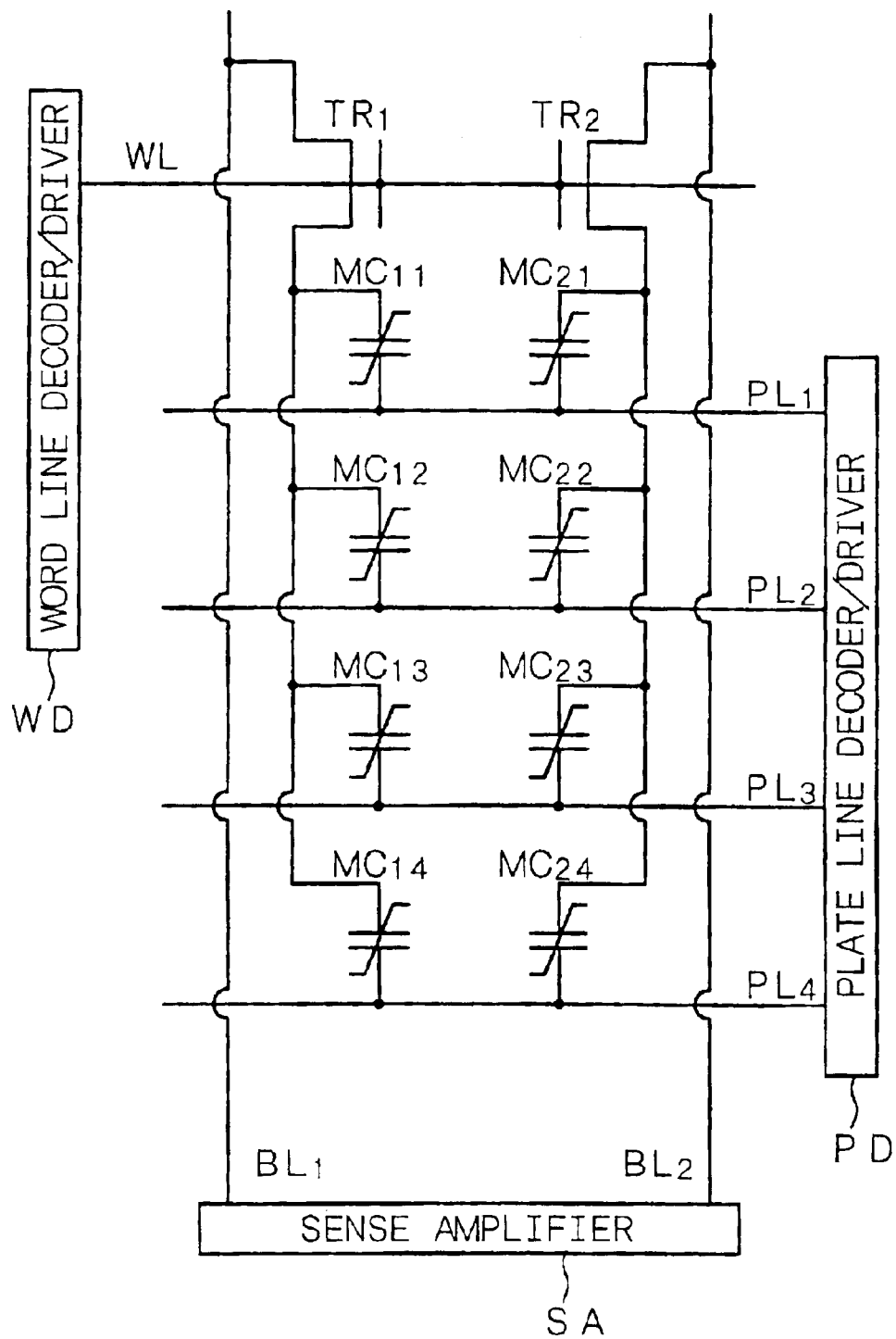
FIG. 25 is a circuit diagram of a ferroelectric-type nonvolatile semiconductor memory disclosed in JP-A-121032/1997.

Further, as a variant of the nonvolatile memory of Example 2, for example, there may be employed a constitution in which first electrodes 21' and 31' may be upper electrodes, and second electrodes 23' and 33' may be lower electrodes as shown in FIG. 22. This structure can be also applied to the nonvolatile memory in any other Example.

The capacitor structure of the nonvolatile memory of the present invention can be applied not only to a nonvolatile memory using a ferroelectric layer (so-called FERAM) but also to a DRAM. In this case, a constant dielectric electric field response (response involving no inversion of a ferroelectric dipole) alone is used.

In the present invention, since the composition of PZT is defined, the disturbance durability can be remarkably improved. Therefore, the nonvolatile memory can be stably operated, and a high degree of integration can be accomplished as compared with a conventional nonvolatile memory.

What is claimed is:

1. A ferroelectric-type nonvolatile semiconductor memory comprising;
   (A) a bit line,
   (B) a transistor for selection,
   (C) a memory unit composed of memory cells that are M in number (M≧2), and
   (D) plate lines that are M in number,
   in which each memory cell comprises a first electrode, a ferroelectric layer and a second electrode,
   in the memory unit, the first electrodes of the memory cells are in common, said common first electrode is connected to the bit line through the transistor for selection,
   in the memory unit, the second electrode of the m-th-place (m=1, 2 . . . , M) memory cell is connected to the m-th-place plate line,
   the ferroelectric layer constituting each memory cell is composed of lead titanate zirconate [Pb($Zr_x$,$Ti_y$)$O_3$], and
   said lead titanate zirconate has a composition that satisfies 0.6<Y/(X+Y)≦0.9.

2. The ferroelectric-type nonvolatile semiconductor memory according to claim 1, in which 0.7<Y/(X+Y)≦0.85 is satisfied.

3. A ferroelectric-type nonvolatile semiconductor memory comprising;
   (A) a bit line,
   (B) a transistor for selection,
   (C) memory units that are N in number (N≧2), each memory unit being composed of memory cells that are M in number (M≧2), and
   (D) plate lines that are M×N in number,
   in which the memory units that are N in number are stacked through an insulating interlayer,
   each memory cell comprises a first electrode, a ferroelectric layer and a second electrode,
   in each memory unit, the first electrodes of the memory cells are in common, said common first electrode is connected to the bit line through the transistor for selection,
   in the memory unit of the n-th layer (n=1, 2 . . . , N), the second electrode of the m-th-place (m=1, 2 . . . , M) memory cell is connected to the [(n−1)M+m]-th-place plate line,
   the ferroelectric layer constituting each memory cell is composed of lead titanate zirconate [Pb($Zr_x$,$Ti_y$)$O_3$], and
   said lead titanate zirconate has a composition that satisfies 0.6<Y/(X+Y)≦0.9.

4. The ferroelectric-type nonvolatile semiconductor memory according to claim 3, in which 0.7<Y/(X+Y)≦0.85 is satisfied.

5. A ferroelectric-type nonvolatile semiconductor memory comprising;
   (A) a bit line,
   (B) transistors for selection that are N in number (N≧2),
   (C) N memory units that are N in number, each memory unit being composed of memory cells that are M in number (M≧2), and
   (D) plate lines that are M in number,
   in which the memory units that are N in number are stacked through an insulating interlayer,
   each memory cell comprises a first electrode, a ferroelectric layer and a second electrode,
   in each memory unit, the first electrodes of the memory cells are in common,
   in the memory unit of the n-th layer (n=1, 2 . . . , N), the common first electrode is connected to the bit line through the n-th-place transistor for selection,
   in the memory unit of the n-th layer, the second electrode of the m-th-place (m=1, 2 . . . , M) memory cell is connected to the m-th-place plate line common to the memory units, the ferroelectric layer constituting each memory cell is composed of lead titanate zirconate [Pb(Zr$_X$,Ti$_Y$)O$_3$], and said lead titanate zirconate has a composition that satisfies 0.6<Y/(X+Y)≦0.9.

6. The ferroelectric-type nonvolatile semiconductor memory according to claim 5, in which 0.7<Y/(X+Y)≦0.85 is satisfied.

7. A ferroelectric-type nonvolatile semiconductor memory comprising;

(A) bit-lines that are N in number (N≧2), (B) transistors for selection that are N in number, (C) memory units that are N in number, each memory cell being composed of memory cells that are M in number (M≧2), and (D) plate lines that are M in number, in which the memory units that are N in number are stacked through an insulating interlayer, each memory cell comprises a first electrode, a ferroelectric layer and a second electrode, in each memory unit, the first electrodes of the memory cells are in common, in the memory unit of the n-th layer (n=1, 2 . . . , N), the common first electrode is connected to the n-th-place bit line through the n-th-place transistor for selection, in the memory unit of the n-th layer, the second electrode of the m-th-place (m=1, 2 . . . , M) memory cell is connected to the m-th-place plate line common to the memory units, the ferroelectric layer constituting each memory cell is composed of lead titanate zirconate [Pb(Zr$_X$,Ti$_Y$)O$_3$], and said lead titanate zirconate has a composition that satisfies 0.6<Y/(X+Y)≦0.9.

8. The ferroelectric-type nonvolatile semiconductor memory according to claim 7, in which 0.7<Y/(X+Y)≦0.85 is satisfied.

* * * * *